United States Patent
Chen et al.

(10) Patent No.: US 10,784,345 B2
(45) Date of Patent: Sep. 22, 2020

(54) STANDARD CELL ARCHITECTURE FOR GATE TIE-OFF

(71) Applicant: QUALCOMM Incorporated, San Diego, CA (US)

(72) Inventors: Xiangdong Chen, San Diego, CA (US); Venugopal Boynapalli, San Diego, CA (US); Hyeokjin Lim, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 16/781,856

(22) Filed: Feb. 4, 2020

(65) Prior Publication Data

US 2020/0176563 A1    Jun. 4, 2020

Related U.S. Application Data

(62) Division of application No. 15/886,611, filed on Feb. 1, 2018, now Pat. No. 10,600,866.

(51) Int. Cl.
*H01L 29/78* (2006.01)
*H01L 29/06* (2006.01)
(Continued)

(52) U.S. Cl.
CPC ...... *H01L 29/0696* (2013.01); *H01L 23/5226* (2013.01); *H01L 23/5283* (2013.01); *H01L 23/53209* (2013.01); *H01L 27/0207* (2013.01); *H01L 27/11807* (2013.01); *H01L 29/0642* (2013.01); *H01L 29/6656* (2013.01); *H01L 29/66545* (2013.01); *H01L 2027/11831* (2013.01); *H01L 2027/11875* (2013.01)

(58) Field of Classification Search
None
See application file for complete search history.

(56) References Cited

U.S. PATENT DOCUMENTS

| | | |
|---|---|---|
| 4,570,176 A | 2/1986 | Kolwicz et al. |
| 6,683,351 B2 | 1/2004 | Morita et al. |

(Continued)

OTHER PUBLICATIONS

International Search Report and Written Opinion—PCT/US2018/064371—ISA/EPO—dated Mar. 15, 2019.
Taiwan Search Report—TW107144984—TIPO—Jul. 21, 2020.

*Primary Examiner* — Ali Naraghi
(74) *Attorney, Agent, or Firm* — Qualcomm Incorporated

(57) ABSTRACT

A chip includes a first gate extended along a second lateral direction, a first source electrically coupled to a power rail, and a first metal interconnect extended along a first lateral direction approximately perpendicular to the second lateral direction, wherein the first metal interconnect lies above the first gate and the first source, and the first metal interconnect is configured to electrically couple the first gate to the first source. The chip also includes a second gate extended along the second lateral direction, a second source electrically coupled to the power rail, and a second metal interconnect extended along the first lateral direction, wherein the second metal interconnect lies above the second gate and second source, the second metal interconnect is configured to electrically couple the second gate to the second source, and the first metal interconnect is aligned with the second metal interconnect in the second lateral direction.

19 Claims, 16 Drawing Sheets

(51) Int. Cl.
    *H01L 23/532*     (2006.01)
    *H01L 23/522*     (2006.01)
    *H01L 29/66*     (2006.01)
    *H01L 23/528*     (2006.01)
    *H01L 27/118*     (2006.01)
    *H01L 27/02*     (2006.01)

(56) References Cited

U.S. PATENT DOCUMENTS

| | | | |
|---|---|---|---|
| 8,618,607 B1 * | 12/2013 | Rashed | H01L 27/0207 |
| | | | 257/359 |
| 10,361,195 B2 | 7/2019 | Sengupta et al. | |
| 2008/0283871 A1 | 11/2008 | Hamada et al. | |
| 2012/0211837 A1 | 8/2012 | Baars et al. | |
| 2014/0124868 A1 | 5/2014 | Kamal et al. | |
| 2014/0159157 A1 * | 6/2014 | Jensen | H01L 29/78 |
| | | | 257/368 |
| 2015/0235948 A1 | 8/2015 | Song et al. | |
| 2015/0249076 A1 | 9/2015 | Chen et al. | |
| 2015/0300826 A1 | 10/2015 | Hayashi | |
| 2015/0311082 A1 | 10/2015 | Bouche et al. | |
| 2015/0311122 A1 | 10/2015 | Rashed et al. | |
| 2016/0079167 A1 * | 3/2016 | Zhu | H01L 27/0207 |
| | | | 257/390 |
| 2016/0300826 A1 | 10/2016 | Lee et al. | |
| 2016/0336183 A1 * | 11/2016 | Yuan | H01L 29/401 |
| 2019/0237542 A1 | 8/2019 | Chen et al. | |
| 2020/0176562 A1 | 6/2020 | Chen et al. | |

* cited by examiner

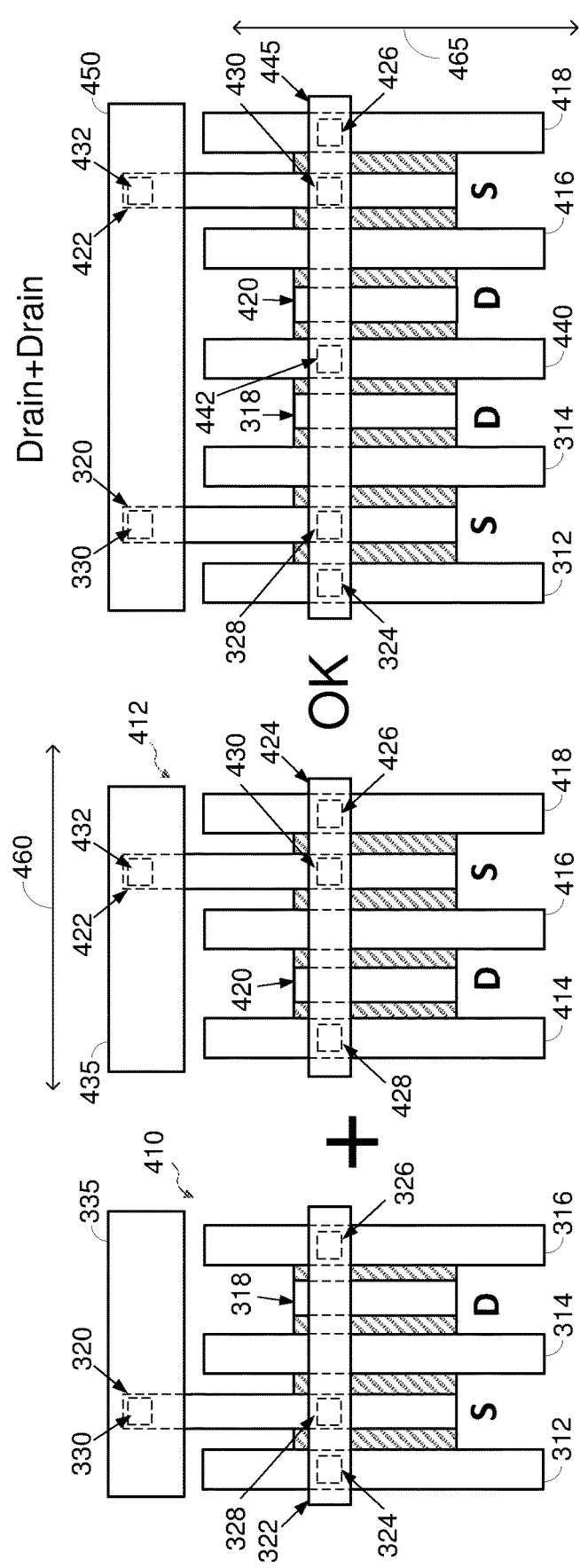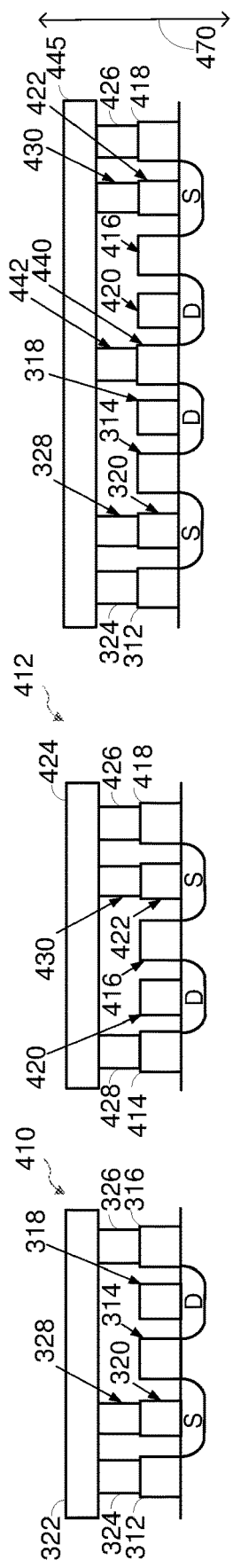
FIG. 4A
FIG. 4B

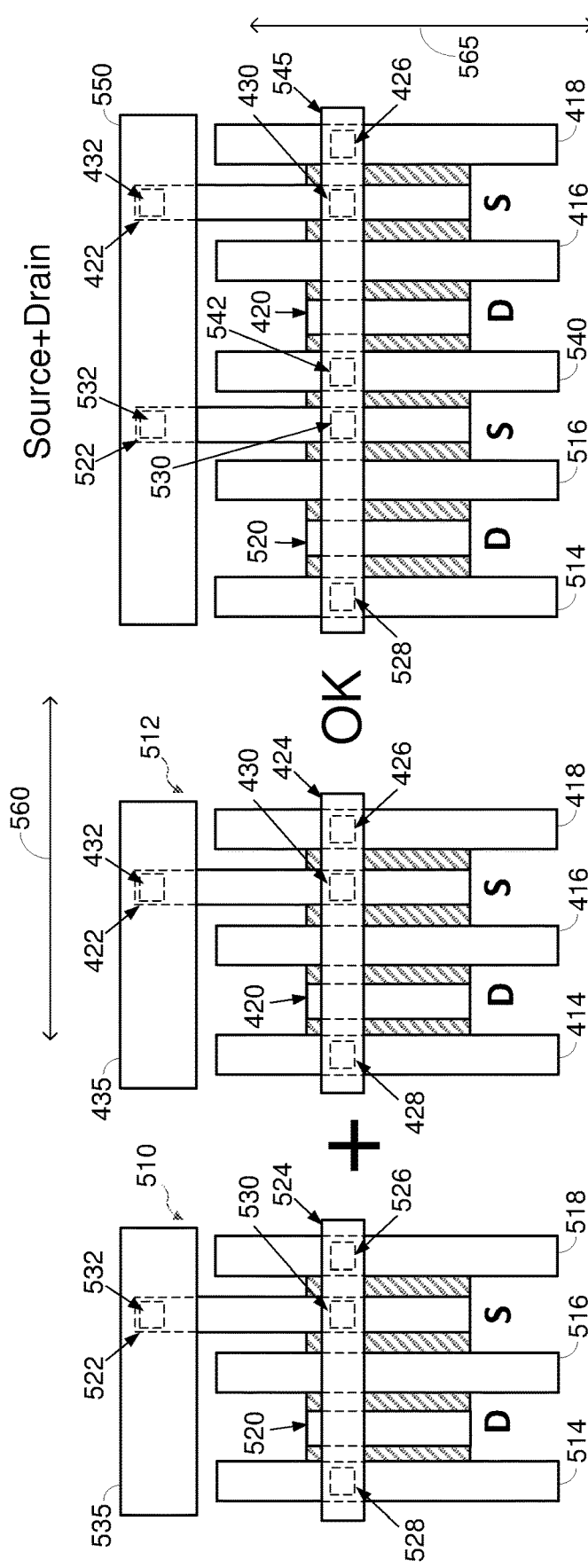
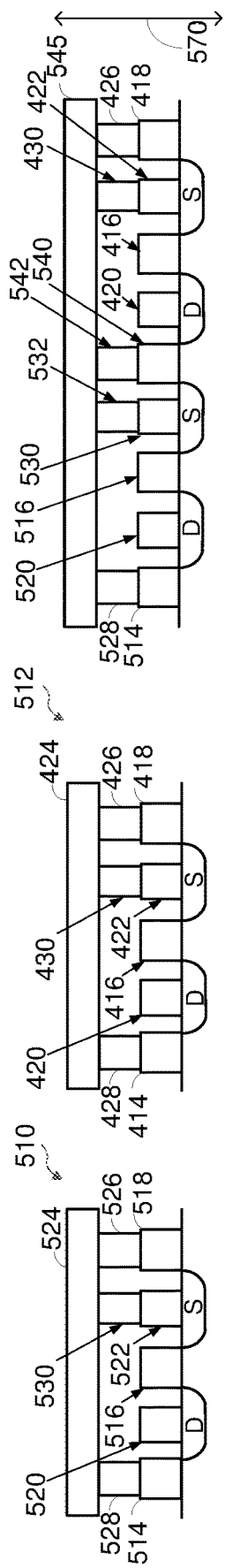
FIG. 5A
FIG. 5B

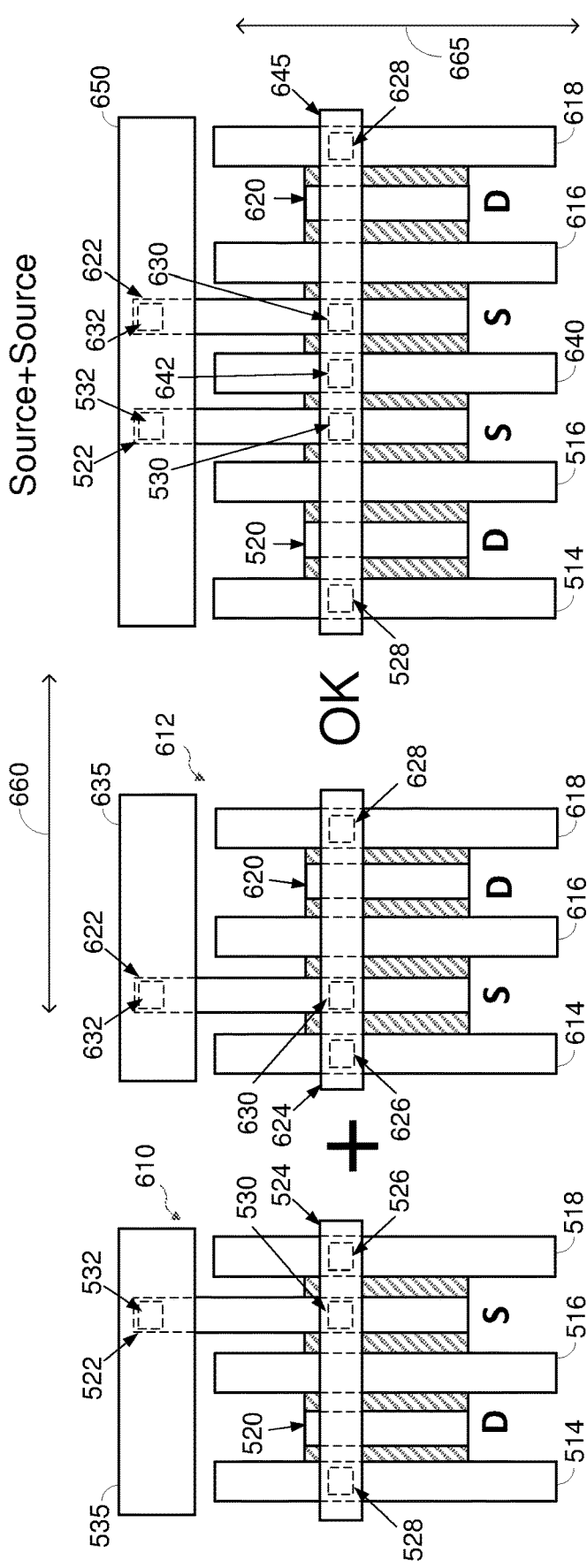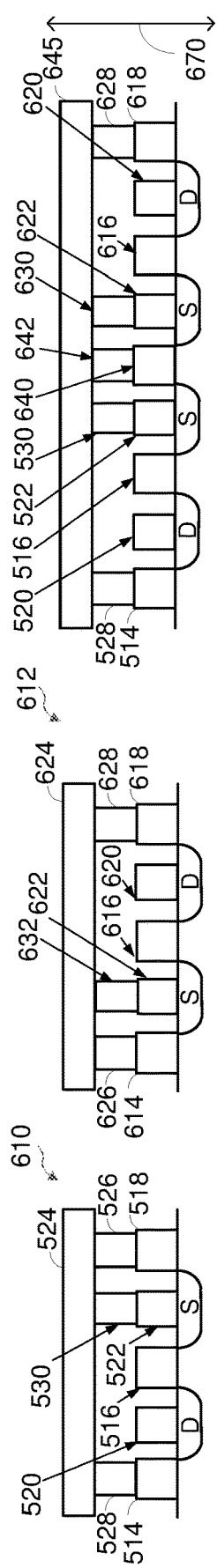
FIG. 6A
FIG. 6B

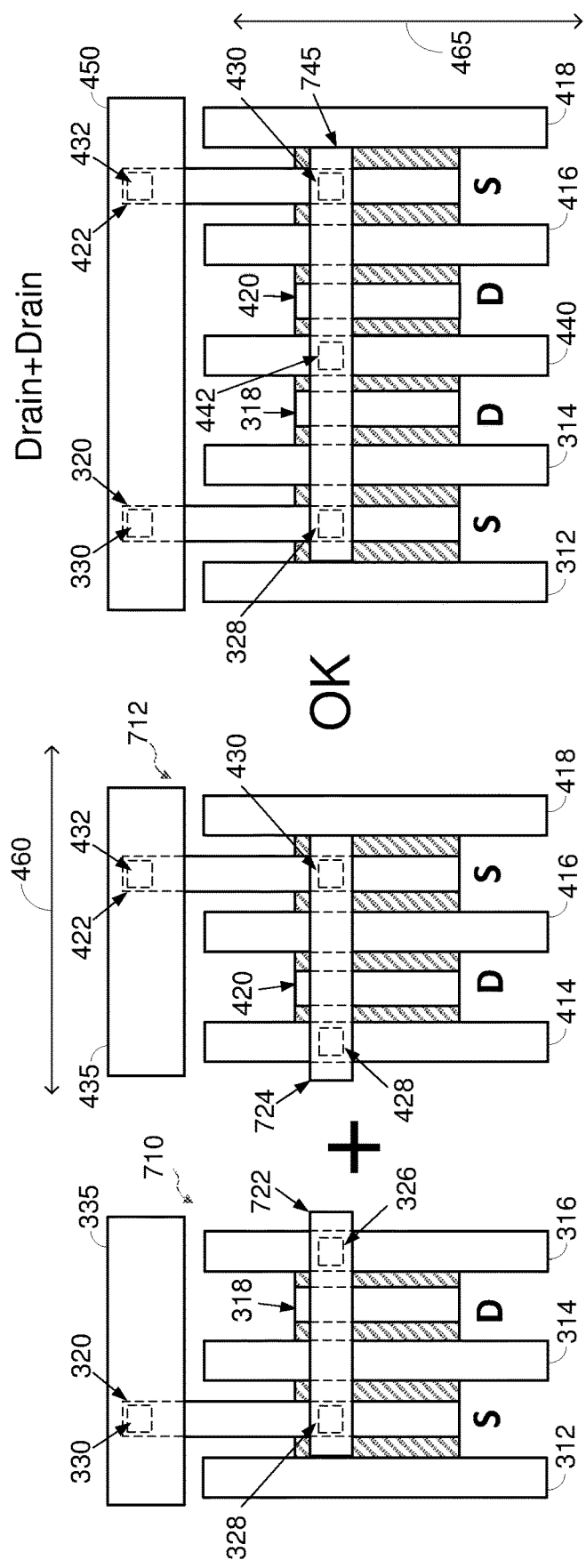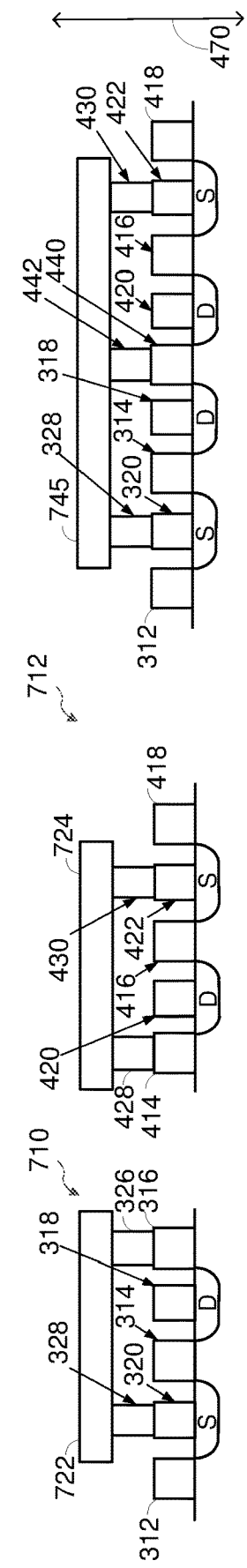
FIG. 7A
FIG. 7B

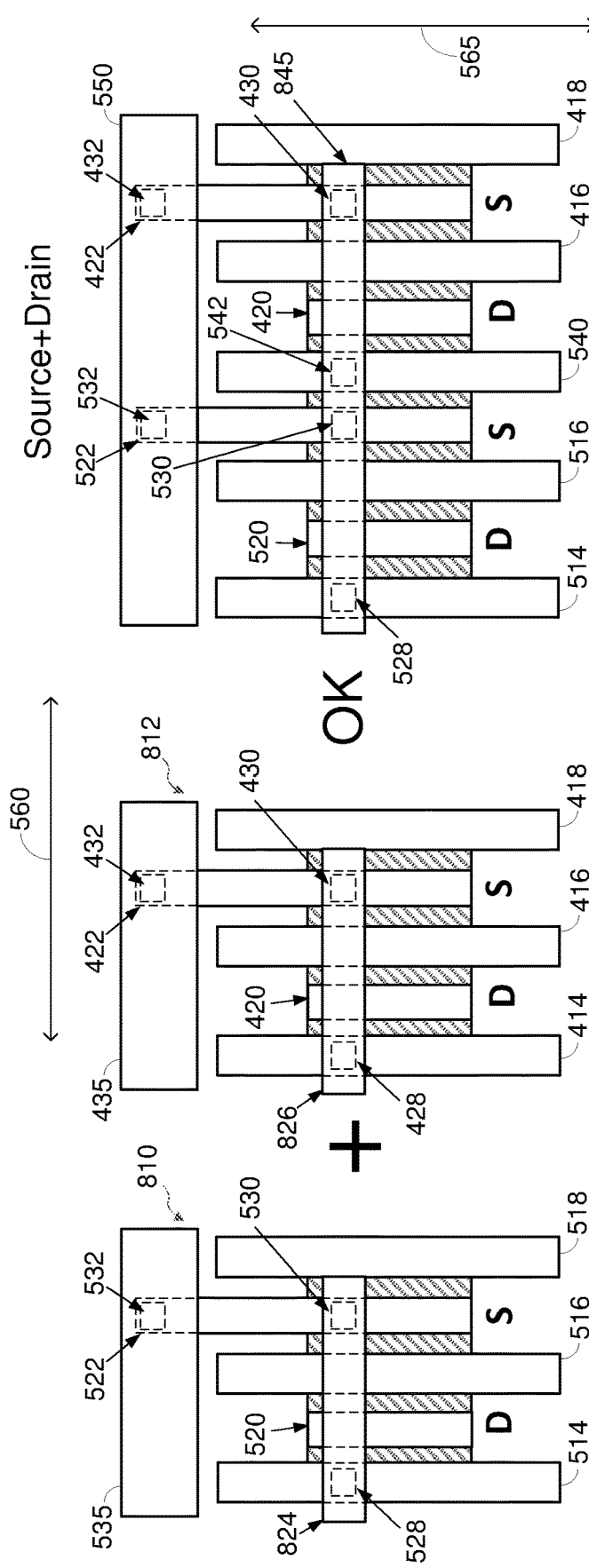
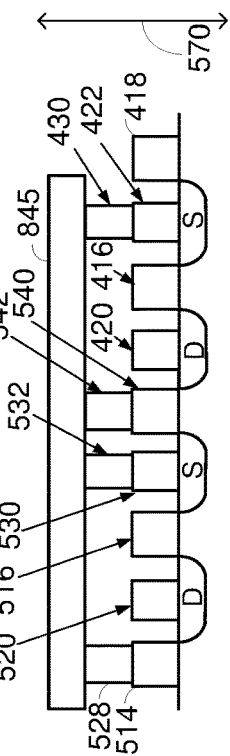
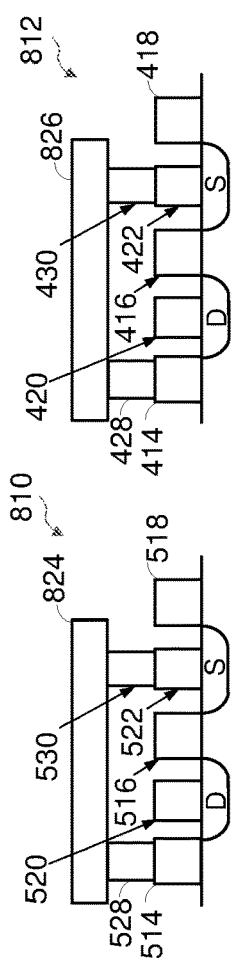
FIG. 8A
FIG. 8B

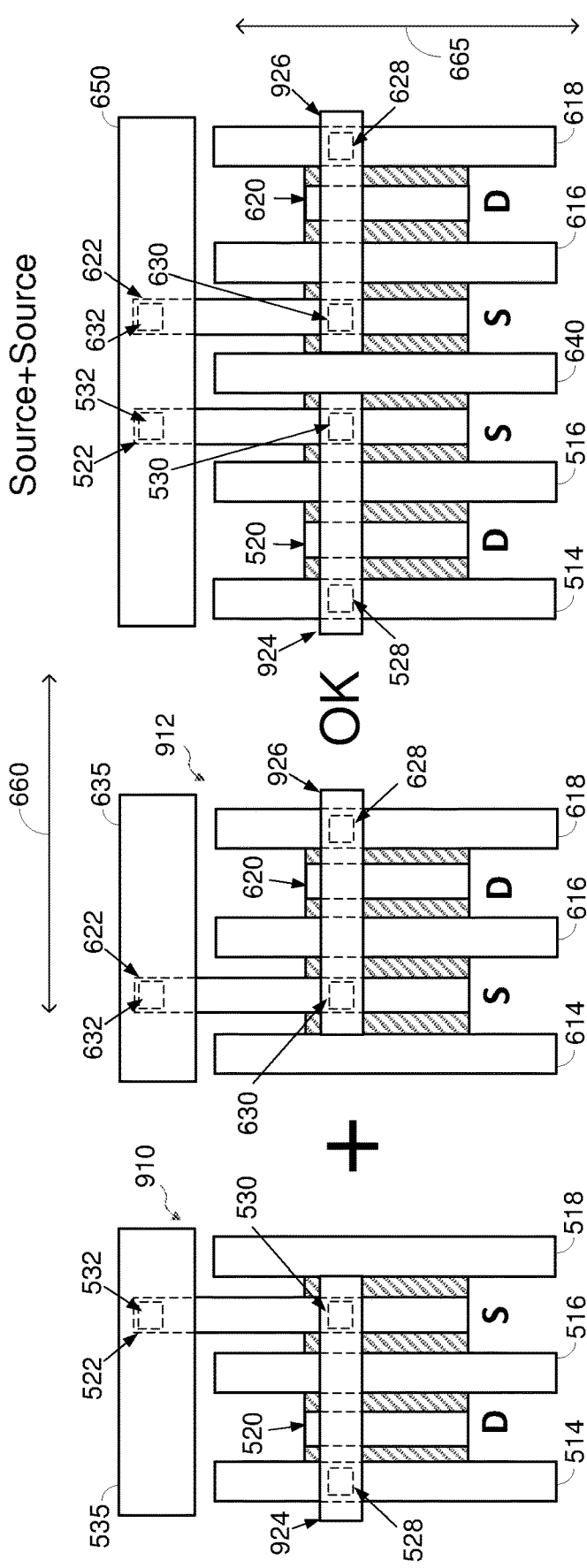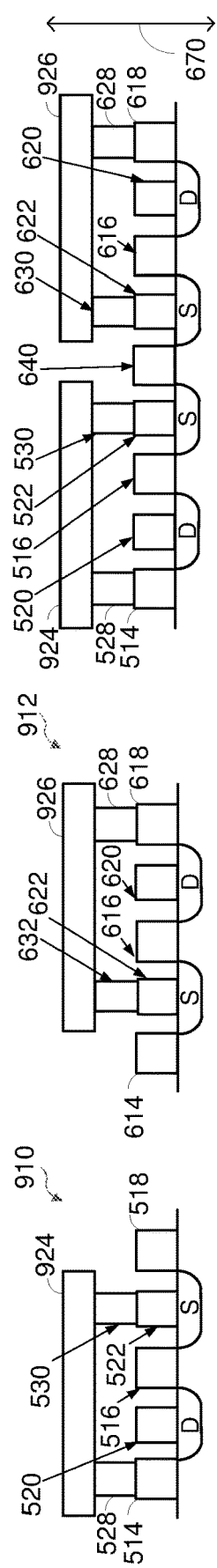
FIG. 9A
FIG. 9B

STANDARD CELL ARCHITECTURE FOR GATE TIE-OFF

RELATED APPLICATION

The present application is a divisional of U.S. application Ser. No. 15/886,611, filed on Feb. 1, 2018, the entire specification of which is incorporated herein by reference.

BACKGROUND

Field

Aspects of the present disclosure relate generally to isolation structures, and more particularly, to gate tie-off structures.

Background

A semiconductor chip (die) may include a large number of transistors, and isolation structures for providing electrical isolation between transistors on the chip. An example of such an isolation structure is a gate tie-off structure, in which a dummy gate is electrically coupled (tied) to a source.

SUMMARY

The following presents a simplified summary of one or more embodiments in order to provide a basic understanding of such embodiments. This summary is not an extensive overview of all contemplated embodiments, and is intended to neither identify key or critical elements of all embodiments nor delineate the scope of any or all embodiments. Its sole purpose is to present some concepts of one or more embodiments in a simplified form as a prelude to the more detailed description that is presented later.

A first aspect relates to a chip. The chip includes a first gate, a first source, a first source contact disposed on the first source, a first metal interconnect above the first source contact and the first gate, a first gate contact electrically coupling the first gate to the first metal interconnect, and a first via electrically coupling the first source contact to the first metal interconnect. The chip also includes a second gate, a second source, a second source contact disposed on the second source, a second metal interconnect above the second source contact and the second gate, a second gate contact electrically coupling the second gate to the second metal interconnect, and a second via electrically coupling the second source contact to the second metal interconnect. Each of the first metal interconnect and the second metal interconnect extends along a first lateral direction, the first metal interconnect is aligned with the second metal interconnect in a second lateral direction, and the first lateral direction is approximately perpendicular to the second lateral direction.

A second aspect relates to a chip. The chip includes a first gate extended along a second lateral direction, a first source electrically coupled to a power rail, and a first metal interconnect extended along a first lateral direction approximately perpendicular to the second lateral direction, wherein the first metal interconnect lies above the first gate and the first source, and the first metal interconnect is configured to electrically couple the first gate to the first source. The chip also includes a second gate extended along the second lateral direction, a second source electrically coupled to the power rail, and a second metal interconnect extended along the first lateral direction, wherein the second metal interconnect lies above the second gate and second source, the second metal interconnect is configured to electrically couple the second gate to the second source, and the first metal interconnect is aligned with the second metal interconnect in the second lateral direction.

To the accomplishment of the foregoing and related ends, the one or more embodiments include the features hereinafter fully described and particularly pointed out in the claims. The following description and the annexed drawings set forth in detail certain illustrative aspects of the one or more embodiments. These aspects are indicative, however, of but a few of the various ways in which the principles of various embodiments may be employed and the described embodiments are intended to include all such aspects and their equivalents.

BRIEF DESCRIPTION OF THE DRAWINGS

FIG. 4A shows a top view of an example of drain-to-drain abutment of a first cell and a second cell according to certain aspects of the present disclosure.

FIG. 4B shows a side view of the drain-to-drain abutment shown in FIG. 4A.

FIG. 5A shows a top view of an example of source-to-drain abutment of a first cell and a second cell according to certain aspects of the present disclosure.

FIG. 5B shows a side view of the source-to-drain abutment shown in FIG. 5A.

FIG. 6A shows a top view of an example of source-to-source abutment of a first cell and a second cell according to certain aspects of the present disclosure.

FIG. 6B shows a side view of the source-to-source abutment shown in FIG. 6A.

FIG. 7A shows a top view of another example of drain-to-drain abutment of a first cell and a second cell according to certain aspects of the present disclosure.

FIG. 7B shows a side view of the drain-to-drain abutment shown in FIG. 7A.

FIG. 8A shows a top view of another example of source-to-drain abutment of a first cell and a second cell according to certain aspects of the present disclosure.

FIG. 8B shows a side view of the source-to-drain abutment shown in FIG. 8A.

FIG. 9A shows a top view of another example of source-to-source abutment of a first cell and a second cell according to certain aspects of the present disclosure.

FIG. 9B shows a side view of the source-to-source abutment shown in FIG. 9A.

DETAILED DESCRIPTION

The detailed description set forth below, in connection with the appended drawings, is intended as a description of various configurations and is not intended to represent the only configurations in which the concepts described herein may be practiced. The detailed description includes specific details for the purpose of providing a thorough understanding of the various concepts. However, it will be apparent to those skilled in the art that these concepts may be practiced without these specific details. In some instances, well-known structures and components are shown in block diagram form in order to avoid obscuring such concepts.

A semiconductor chip (die) may include a large number of transistors, and isolation structures for providing electrical isolation between transistors on the chip. An example of such an isolation structure is a gate tie-off structure, in which a dummy gate is electrically coupled (tied) to a source. Coupling the dummy gate to the source turns off the channel under the dummy gate, thereby providing electrical isolation between transistors on opposite sides of the dummy gate.

Figure 1:
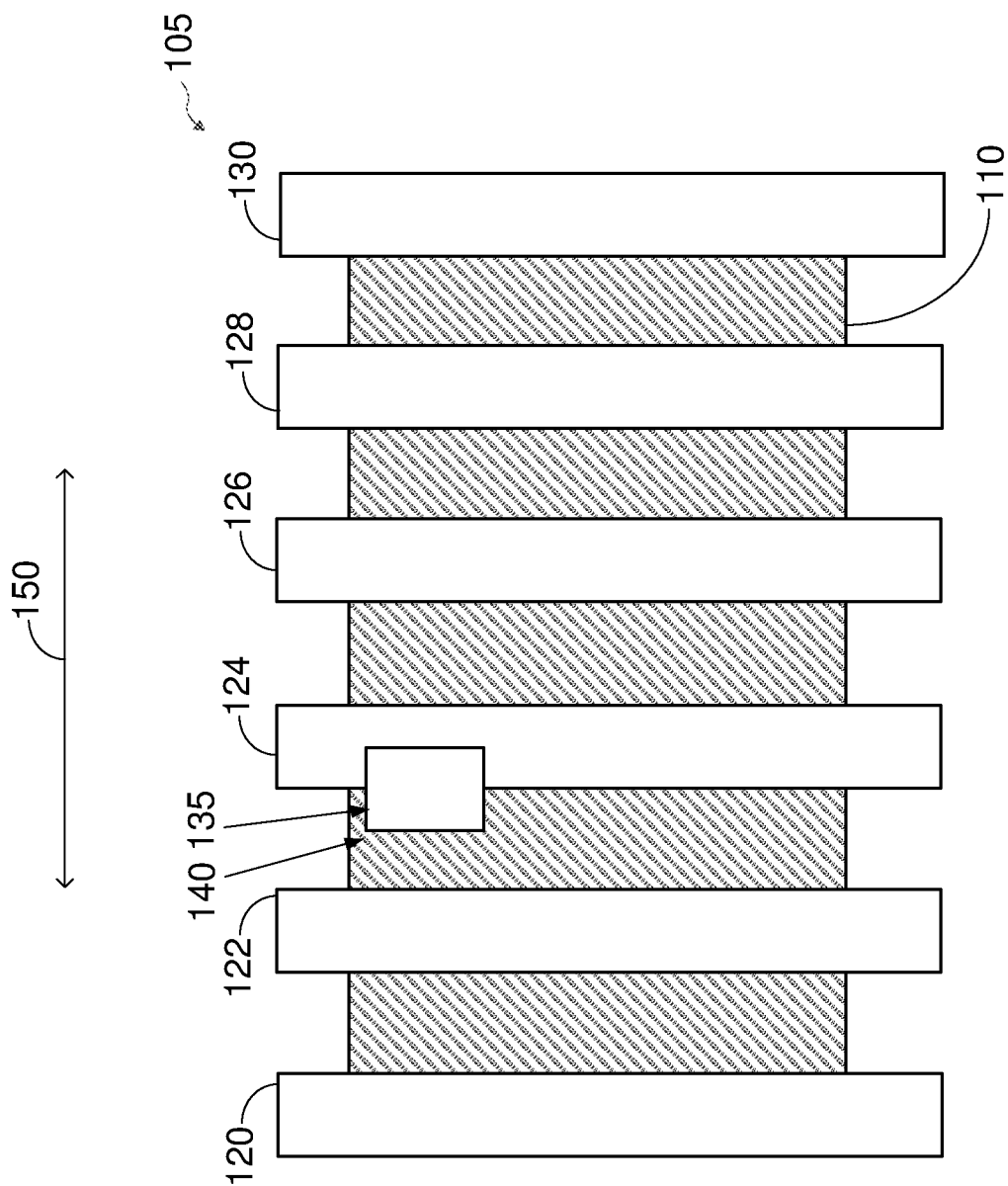
FIG. 1 shows an example of a gate tie-off structure according to certain aspects of the present disclosure.

FIG. 1 shows a top view of an example of a cell 105 including a gate tie-off structure according to certain aspects of the present disclosure. In this example, the cell 105 includes an active region 110, and multiple gates 120, 122, 124, 126, 128 and 130. For a fin-type field effect transistor (finFET) process, the active region 110 may include multiple fins that extend across the cell 105 in lateral direction 150. For ease of illustration, the individual fins are not shown in FIG. 1. As used herein, the term "lateral" refers to a direction that runs parallel with the substrate of the chip.

The active region 110 and gates 122, 126 and 128 form transistors in the cell 105. For the example of a finFET process, each gate 122, 126 and 128 is formed over a respective portion of the fins of the active region 110 with a thin dielectric layer disposed between the gate and the fins. In this example, each gate 122, 126 and 128 forms the gate of a transistor in the cell 110 with portions of the fins on opposite sides of the gate forming the source and drain of the transistor.

In the example shown in FIG. 1, the gate tie-off structure includes gate 124 and a contact 135 electrically coupling (tying) gate 124 to a neighboring (adjacent) source 140. The contact 135 may be coupled to the source through a source contact (not shown in FIG. 1) disposed on the source 140. Coupling gate 124 to the source 140 turns off the channel under gate 124, thereby providing electrical isolation between transistors on opposite sides of gate 124. The contact 135 is formed from a contact layer, which may also be used to form gate contacts (not shown) for coupling the gates of the transistors to upper interconnect metal layers (not shown). If the source 140 is the source of a p-type field effect transistor (PFET), then the source 140 may be coupled to a voltage supply rail, and, if the source 140 is the source of an n-type field effect transistor (NFET), then the source 140 may be coupled to a ground rail.

The gate tie-off structure shown in FIG. 1 provides electrical isolation between transistors on opposite sides of gate 124 without having to cut (break) the fins under gate 124. This is because the gate-off structure turns off the channel under gate 124 by coupling (tying) gate 124 to the source 140. As a result, the fins of the active region 110 may run continuously under gate 124.

In an alternative electrical isolation approach, the fins are cut under gate 124 to provide electrical isolation between transistors on opposite sides of gate 124. In this approach, the space formed by cutting the fins is filled with an electrical isolation material (e.g., dielectric material), which introduces stresses in the fins that is sensitive to process variation. The stresses in the fins change the electrical characteristics of the transistors in the cell 105. Since the stresses in the fins are sensitive to process variation, the resulting changes in the electrical characteristics of the transistors are also sensitive to process variation, leading to uncertainty in the electrical characteristics of the transistors. The gate tie-off structure overcomes this drawback by providing electrical isolation between transistors on opposite sides of gate 124 without having to cut (break) the fins under gate 124.

The exemplary gate tie-off structure shown in FIG. 1 may be used to electrically isolate transistors in two cells that abut each other. In this regard, FIGS. 2A-2C below show examples of three different abutment scenarios for two cells.

Figure 2A:
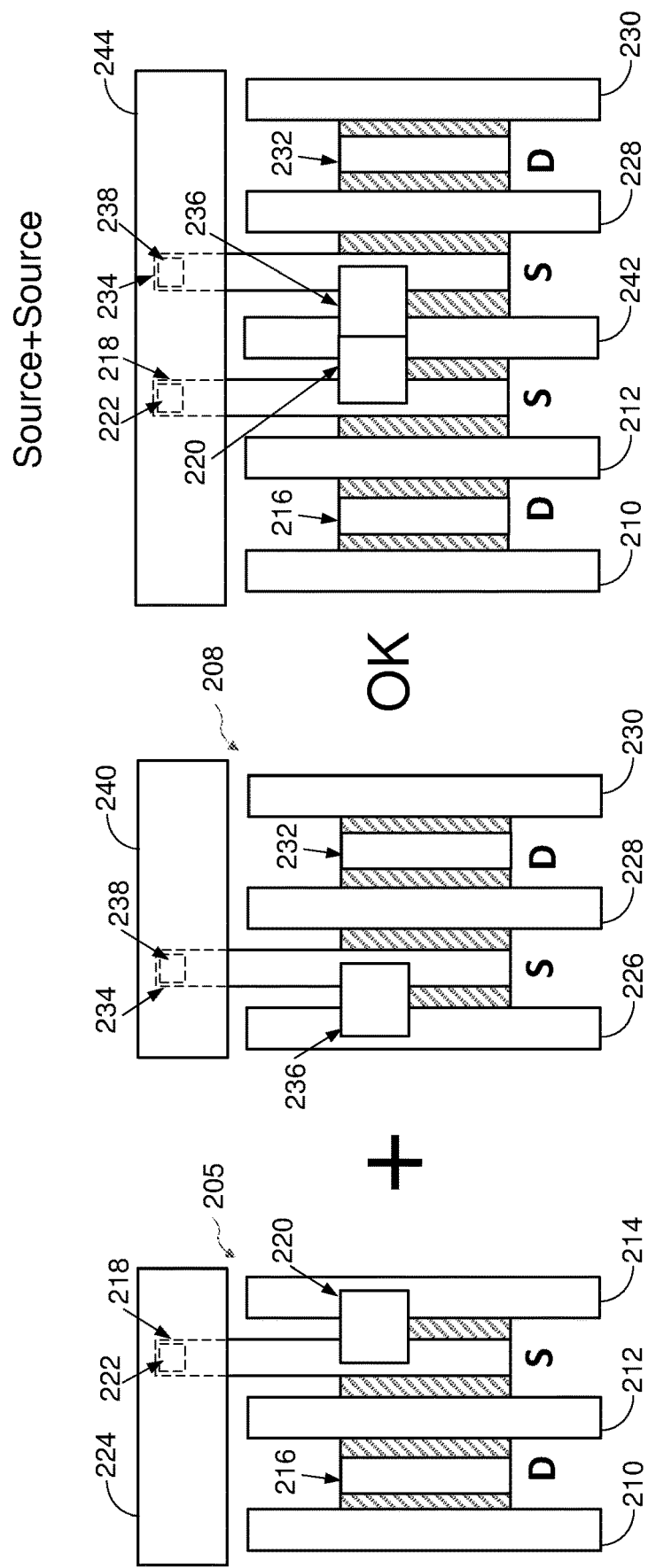
FIG. 2A shows an example of source-to-source abutment of two cells according to certain aspects of the present disclosure.

FIG. 2A shows a top view of an example of source-to-source abutment of a first cell 205 and a second cell 208. The first cell 205 includes multiple gates 210, 212 and 214, a source (labeled "S"), and a drain (labeled "D"). Gate 212, the source, and the drain form a transistor in the first cell 205. The first cell 205 also includes a drain contact 216 disposed on the drain, and a source contact 218 disposed on the source. The drain and source contacts 216 and 218 may be formed from a contact layer, which may be different from the contact layer used to form gate contacts (not shown). The first cell 205 also includes a via 222 electrically coupling the source contact 218 (and hence the source) to a power rail 224, which lies above the source contact 218. For the example in which the source is the source of a PFET, the power rail 224 may be a voltage supply rail, and, for the example in which the source is the source of an NFET, the power rail may be a ground rail. Note that structures below the power rail 224 are shown in dashed lines in FIG. 2A.

The first cell 205 further includes a gate tie-off structure including gate 214 and a contact 220 electrically coupling (tying) gate 214 to the source contact 218 (and hence the source in the first cell 205). By coupling gate 214 to the source, the gate tie-off structure turns off the channel under gate 214, thereby providing electrical isolation for the transistor in the first cell 205.

The second cell 208 includes multiple gates 226, 228 and 230, a source (labeled "S"), and a drain (labeled "D"). Gate 228, the source, and the drain form a transistor in the second cell 208. The second cell 208 also includes a drain contact 232 disposed on the drain, and a source contact 234 disposed on the source. The drain and source contacts 232 and 234 may be formed from the same contact layer used to form the drain and source contacts 216 and 218 in the first cell 205. The second cell 208 also includes a via 238 electrically coupling the source contact 234 (and hence the source) to a power rail 240, which lies above the source contact 234. Note that structures below the power rail 240 are shown in dashed lines in FIG. 2A.

The second cell 208 further includes a gate tie-off structure including gate 226 and a contact 236 electrically coupling (tying) gate 226 to the source contact 234 (and hence the source in the second cell 208). By coupling gate 226 to the source, the gate tie-off structure turns off the channel under gate 226, thereby providing electrical isolation for the transistor in the second cell 208.

The right-hand side of FIG. 2A shows an example in which the source side of the first cell 205 abuts the source side of the second cell 208. In this example, gates 214 and 226 are merged into gate 242, in which gate 242 is coupled to the source in the first cell 205 by contact 220 and coupled to the source in the second cell 208 by contact 236. Also, the sources in the first and second cells are coupled to a common power rail 244, which lies above the source contacts 218 and 238. Since gate 242 is coupled (tied) to the sources in the first cell 205 and the second cell 208, the channel under gate 242 is turned off, thereby providing electrical isolation between the transistors in the first cell 205 and the second cell 208. In this example, gate 242 is a dummy gate coupled to two neighboring sources by contacts 220 and 236. Thus, the gate tie-off structure shown in FIG. 1 supports source-to-source abutment of two cells.

Figure 2B:
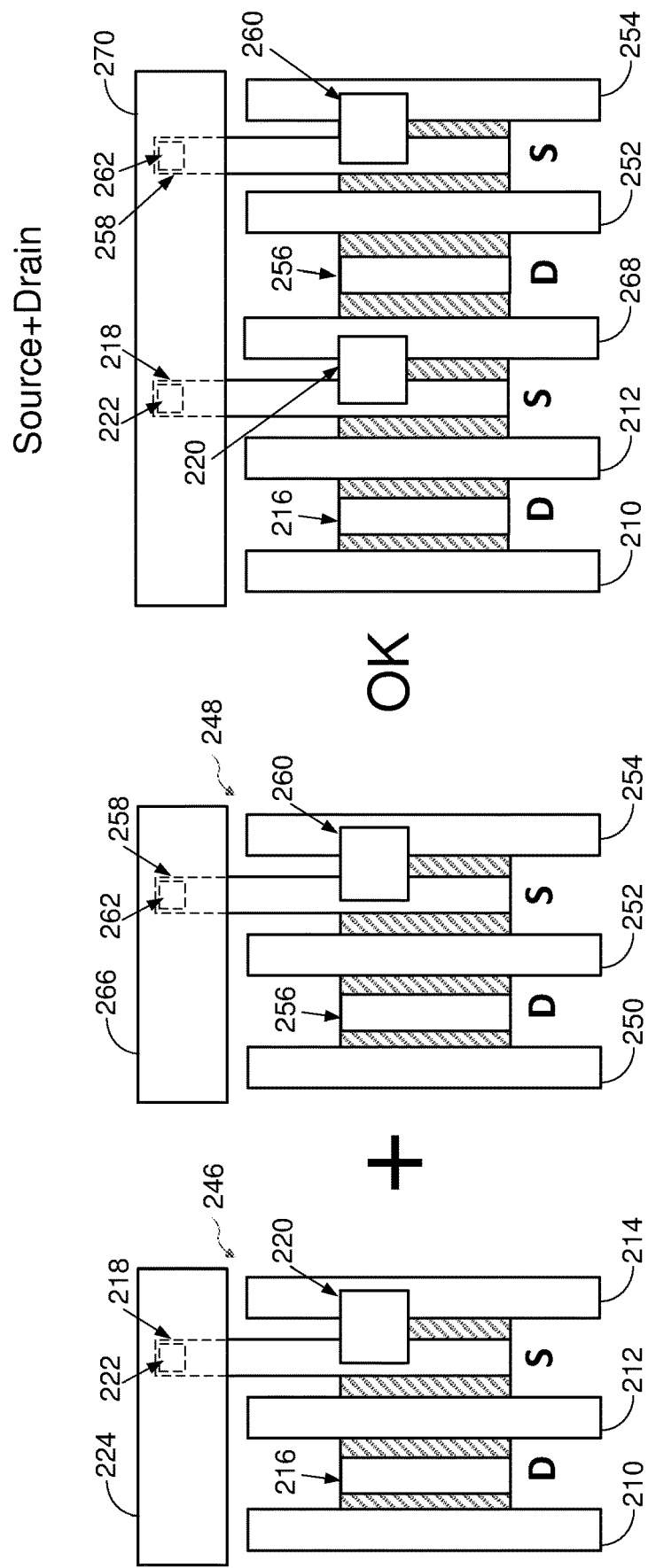
FIG. 2B shows an example of source-to-drain abutment of two cells according to certain aspects of the present disclosure.

FIG. 2B shows a top view of an example of source-to-drain abutment of a first cell 246 and a second cell 248. The first cell 246 is structurally the same as the first cell 205 discussed above with reference to FIG. 2A. Accordingly, the description of the first cell 205 provided above applies to the first cell 246 in FIG. 2B.

The second cell 248 includes multiple gates 250, 252 and 254, a source (labeled "S"), and a drain (labeled "D"). Gate 252, the source, and the drain form a transistor in the second cell 248. The second cell 248 also includes a drain contact 256 disposed on the drain, and a source contact 258 disposed on the source. The second cell 248 also includes a via 262 electrically coupling the source contact 258 (and hence the source) to a power rail 266, which lies above the source contact 258. Note that structures below the power rail 266 are shown in dashed lines.

The second cell 248 further includes a gate tie-off structure including gate 254 and a contact 260 electrically coupling (tying) gate 254 to the source contact 258 (and hence the source in the second cell 248). By coupling gate 254 to the source, the gate tie-off structure turns off the channel under gate 254, thereby providing electrical isolation for the transistor in the second cell 248.

The right-hand side of FIG. 2B shows an example in which the source side of the first cell 246 abuts the drain side of the second cell 248. In this example, gates 214 and 250 are merged into gate 268, in which gate 268 is coupled to the source in the first cell 246 by contact 220. Also, the sources in the first and second cells are coupled to a common power rail 270. Since gate 268 is coupled (tied) to the source in the first cell 246, the channel under gate 268 is turned off, thereby providing electrical isolation between the transistors in the first cell 246 and the second cell 248. In this example, gate 268 is a dummy gate coupled to one of two neighboring sources by contact 220. Thus, the gate tie-off structure shown in FIG. 1 supports source-to-drain abutment of two cells.

Figure 2C:
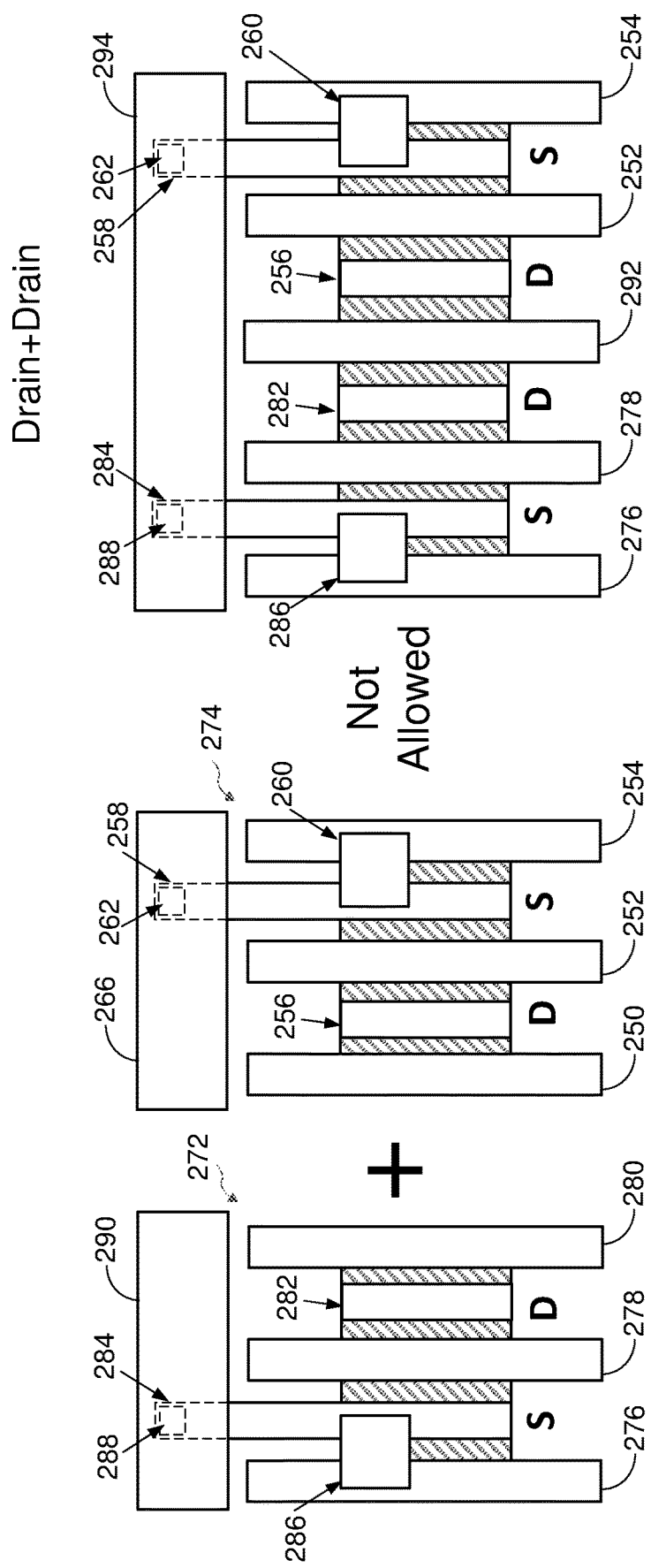
FIG. 2C shows an example of drain-to-drain abutment of two cells according to certain aspects of the present disclosure.

FIG. 2C shows a top view of an example of drain-to-drain abutment of a first cell 272 and a second cell 274. As explained further below, the gate tie-off structure discussed above does not support drain-to-drain abutment of two cells.

The first cell 272 includes multiple gates 276, 278 and 280, a source (labeled "S"), and a drain (labeled "D"). Gate 278, the source, and the drain form a transistor in the first cell 272. The first cell 272 also includes a drain contact 282 disposed on the drain, and a source contact 284 disposed on the source. The drain and source contacts 282 and 284 may be formed from a contact layer, which may be different from the contact layer used to form gate contacts (not shown). The first cell 272 also includes a via 288 electrically coupling the source contact 284 (and hence the source) to a power rail 290, which lies above the source contact 284. Note that structures below the power rail 290 are shown in dashed lines in FIG. 2C.

The first cell 272 further includes a gate tie-off structure including gate 276 and a contact 286 electrically coupling (tying) gate 276 to the source contact 284 (and hence the source in the first cell 272). By coupling gate 276 to the source, the gate tie-off structure turns off the channel under gate 276, thereby providing electrical isolation for the transistor in the first cell 272.

The second cell 274 is structurally the same as the second cell 248 discussed above with reference to FIG. 2B. Accordingly, the description of the second cell 248 provided above applies to the second cell 274 in FIG. 2C.

The right-hand side of FIG. 2C shows an example in which the drain side of the first cell 272 abuts the drain side of the second cell 274. Gates 280 and 250 are merged into gate 292, and the sources in the first and second cells are coupled to a common power rail 294. In this example, gate 292 is surrounded by drains on both sides with no neighboring source. Thus, gate 292 cannot be coupled (tied) to a source using a contact to provide electrical isolation between the transistors in first cell 272 and the second cell 274. Therefore, the gate tie-off structure discussed above does not support drain-to-drain abutment of two cells.

Another challenge with the gate tie-off structure discussed above is that it may be difficult to control alignment of the contact coupling the dummy gate to a source. Misalignment of the contact may cause the contact to touch the gate of an adjacent transistor, shorting the gate of the transistor to the source. This may permanently turn off the transistor, thereby rendering the transistor non-functional.

Accordingly, there is a need for gate tie-off structures that overcome one or more of the drawbacks discussed above.

Figure 3A:
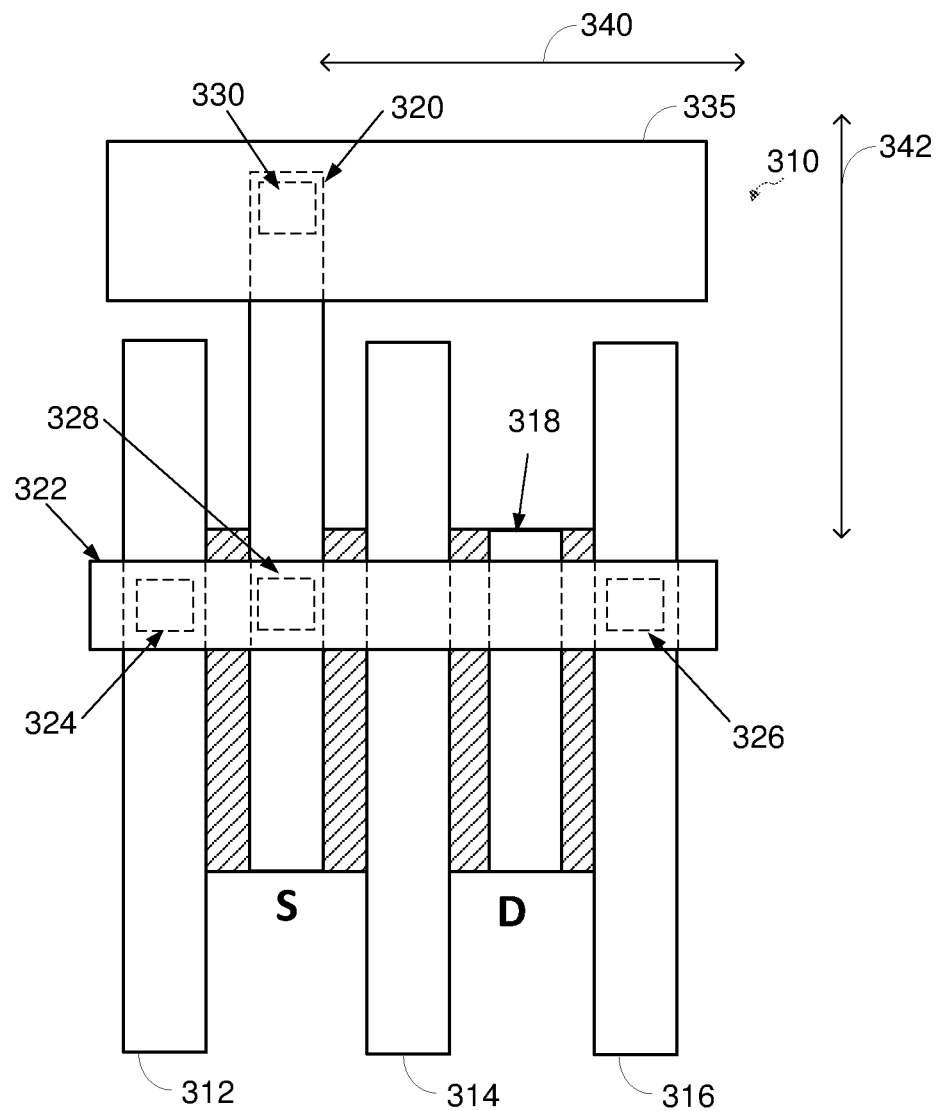
FIG. 3A shows a top view of an exemplary gate tie-off structure including a metal interconnect according to certain aspects of the present disclosure.

In this regard, FIG. 3A shows a top view of an exemplary gate tie-off structure for a cell 310 on a chip according to certain aspects of the present disclosure. As discussed further before, the exemplary gate tie-off structure shown in FIG. 3A supports drain-to-drain abutment of two cells.

In this example, the cell 310 includes multiple gates 312, 314 and 316, a source (labeled "S"), and a drain (labeled "D"). Gates 312 and 316 are located on the boundary of the cell 310 in this example. Gate 314, the source, and the drain form a transistor in the cell 310. The cell 310 also includes a drain contact 318 disposed on the drain, and a source contact 320 disposed on the source. The drain and source contacts 318 and 320 may be formed from a contact layer, which may be different from the contact layer used to form gate contacts. The cell 310 also includes a via 330 electrically coupling the source contact 320 (and hence the source) to a power rail 335, which lies above the source contact 320. Note that structures below the power rail 335 are shown in dashed lines in FIG. 3A. For the example in which the transistor in the cell 310 is a PFET, the power rail 335 may be a voltage supply rail (e.g., Vdd rail), and, for the example in which the transistor in the cell 310 is an NFET, the power rail 335 may be a ground rail (e.g., Vss rail).

The gate tie-off structure includes a metal interconnect 322, which may be formed from a metal layer (i.e., bottom-most metal layer) in the back end of line (BEOL) of the chip (die). The metal interconnect 322 lies above the gates 312, 314 and 316, the drain contact 318, and the source contact 320. Note that structures under the metal interconnect 322 are shown in dashed lines. In the example in FIG. 3A, the metal interconnect 322 extends across the cell 310 in lateral direction 340. In some aspects, the metal interconnect 322 may be formed from the same metal layer used to form the power rail 335 (e.g., using lithographic and etching processes), and may run parallel to the power rail 335. For example, the metal interconnect 322 and the power rail 335 may be formed from the same metal layer (e.g., bottom-most metal layer) in the BEOL of the chip.

The gate tie-off structure also includes a first gate contact 324 disposed between gate 312 and the metal interconnect 322, a second gate contact 326 disposed between gate 316 and the metal interconnect 322, and a via 328 disposed between the source contact 320 and the metal interconnect 322. In this example, the first gate contact 324 couples gate 312 to the metal interconnect 322, the second gate contact 326 couples gate 316 to the metal interconnect 322, and the via 328 couples the source contact 320 to the metal interconnect 322. Thus, gate 312 is electrically coupled to the source contact 320 (and hence the source) through the first gate contact 324, the metal interconnect 322, and the via 328. Similarly, gate 316 is electrically coupled to the source contact 320 (and hence the source) through the second gate contact 326, the metal interconnect 322, and the via 328. Thus, in this example, gates 312 and 316 are dummy gates that are electrically coupled (tied) to the source through the metal interconnect 322. Since gates 312 and 316 are located on the boundary of the cell 310, electrically coupling gates 312 and 316 to the source through metal interconnect 322 provides electrical isolation for the transistor in the cell 310 from other cells (not shown).

Figure 3B:
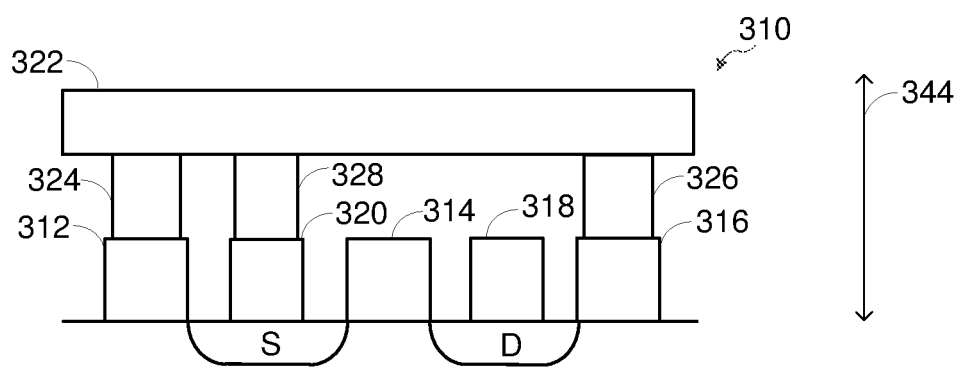
FIG. 3B shows a side view of the exemplary gate tie-off structure shown in FIG. 3A.

FIG. 3B shows a side view of the exemplary gate tie-off structure. As shown in FIG. 3B, the metal interconnect 322 passes (crosses) over the drain contact 318, and is separated from the drain contact 318 in the vertical direction 344 by a space (gap). The space may be filled with an electrical isolation material to electrically isolate the metal interconnect 322 from the drain contact 318, allowing the metal interconnect 322 to pass over the drain contact 318 without electrically shorting to the drain contact 318. The metal interconnect 322 also passes (crosses) over the gate 314 of the transistor in the cell 310, and is separated from the gate 314 of the transistor in the vertical direction 344 by a space (gap). The space may be filled with an electrical isolation material to electrically isolate the metal interconnect 322 from the gate 314, allowing the metal interconnect 322 to pass over the gate 314 without electrically shorting to the gate 314. As used herein, the term "vertical" refers to a direction that runs perpendicular to the substrate of the chip.

Thus, the metal interconnect 322 passes (crosses) over the drain contact 318 and the gate 314 of the transistor without electrically shorting to the drain contact 318 and the gate 314 of the transistor. This allows the metal interconnect to couple dummy gate 316 to the source contact 320 (and hence the source) even though dummy gate 316 is not adjacent to the source. In contrast, the gate tie-off structure discussed above with reference to FIG. 1 requires that a dummy gate have a neighboring (adjacent) source in order to couple (tie) the dummy gate to a source. The exemplary gate tie-off structure shown in FIGS. 3A and 3B does not have this restriction, allowing for drain-to-drain abutment, as discussed further below.

In the example shown in FIG. 3B, the source and the drain are depicted as doped regions in the substrate of the chip (die) for a planar transistor. However, it is to be appreciated that for the example of a finFET, the source and drain may be formed from multiple fins (not shown in FIG. 3B) that extend across the cell 310 in lateral direction 340. Accordingly, it is to be appreciated that aspects of the present disclosure apply to both planar transistors and finFETs.

As shown in FIG. 3A, the drain contact 318 extends under the metal interconnect 322 in lateral direction 342. This allows the drain contact 318 to extend over a larger area of the drain, which reduces the contact resistance of the drain. The drain contact 318 is able to extend under the metal interconnect 322 because the metal interconnect 322 is separated from the drain contact 310 in the vertical direction 344 by a space (gap) that prevents shorting of the metal interconnect 322 to the drain contact 318. For a finFET process, this allows the drain contact 318 to extend across the cell 310 in lateral direction 342, and make contact with all of the fins for low contact resistance.

Without the space (gap) between the metal interconnect 322 and the drain contact 318, the drain contact 318 is not able to pass under the metal interconnect 322 without shorting the drain contact 318 to the metal interconnect 322. In this case, the drain contact can only partially extend over the drain, in which the drain contact and the metal interconnect need to be separated by a margin in lateral direction 342 to prevent the drain contact from shorting to the metal interconnect. The partial drain contact in this case may significantly increase the contact resistance of the drain compared with the drain contact 318 shown in FIG. 3A, which may extend fully across the drain in lateral direction 342 for low contact resistance.

In certain aspects, gate contacts 324 and 326 are self-aligned gate contacts that are formed using a self-aligned contact process. For each gate, the self-aligned contact process may include the following steps. Spacers (e.g., nitrite spacers) may be formed on opposite sides of the gate, in which the space between the spacers is filled with a filler material (e.g., oxide material). The filler material may then be removed using a selective etching process that etches away the filler material without etching away the spacers, thereby creating an opening between the spacers. The resulting opening is directly above the gate and is electrically isolated from neighboring drain/source contact(s) by the spacers. A metal may then be deposited in the opening to form the respective gate contact. The resulting gate contact is self-aligned. This is because the spacers (e.g., nitride spacers) define the opening in which the gate contact is formed, making formation of the gate contact significantly more tolerant of gate contact patterning misalignment. The self-aligned gate contact helps prevent misalignment of the gate contact, which facilitates side-by-side placement of the gate contact and a neighboring drain/source contact without shorting the gate contact to the neighboring drain/source contact.

FIG. 3B shows an example in which the gate contacts 324 and 326 are coupled directly to the metal interconnect 322. However, it is to be appreciated that the present disclosure is not limited to this example. For example, each of the gate contacts 324 and 326 may be coupled to the metal interconnect 322 through a respective via disposed between the gate contact and the metal interconnect 322.

Referring to FIG. 3A, it is to be appreciated that the drain contact 318 may be coupled to a signal routing structure (not shown) for routing signals to and/or from the drain. The routing structure may include a via (not shown) disposed on the drain contact 318, in which the via is offset from the metal interconnect 322 in lateral direction 342 to prevent shorting of the drain to the metal interconnect 322. Similarly, is to be appreciated that the gate 314 of the transistor may be coupled to a signal routing structure (not shown) for routing signals to and/or from the gate 314. The routing structure may include a gate contact (not shown) disposed on the gate 314, in which the gate contact is offset from the metal interconnect 322 in lateral direction 342 to prevent shorting of the gate 314 to the metal interconnect 322.

It is to be appreciated that the cell 310 may include additional transistors between gates 312 and 316, in which gates 312 and 316 are coupled to the source of at least one of the transistors in the cell 310 through the metal interconnect 322. Since gates 312 and 316 are located on the boundary of the cell 310, coupling gates 312 and 316 to the source of at least one of the transistors through the metal interconnect 322 electrically isolates the transistors in the cell 310 from other cells (not shown). In this example, the metal interconnect 322 may extend over the transistors in the cell 310 in lateral direction 340.

As discussed above, the exemplary gate tie-off structure shown in FIGS. 3A and 3B supports drain-to-drain abutment of two cells. An example of this will now be discussed below with reference to FIGS. 4A and 4B.

FIG. 4A shows a top view of an example of drain-to-drain abutment of a first cell 410 and a second cell 412. The first cell 410 is structurally the same as the cell 310 discussed above with reference to FIGS. 3A and 3B. Accordingly, the description of the cell 310 provided above applies to the first cell 410.

The second cell 412 includes multiple gates 414, 416 and 418, a source (labeled "S"), and a drain (labeled "D"). Gates 414 and 418 are located on the boundary of the second cell 412 in this example. Gate 416, the source, and the drain form a transistor in the second cell 412. The second cell 412 also includes a drain contact 420 disposed on the drain, and a source contact 422 disposed on the source. The second cell 412 also includes a via 432 electrically coupling the source contact 422 (and hence the source) to a power rail 435, which lies above the source contact 422. Note that structures below the power rail 435 are shown in dashed lines.

The second cell 412 further includes a gate tie-off structure including a metal interconnect 424, which may be formed from the same metal layer as the metal interconnect 322 of the first cell 410. The metal interconnect 424 lies above the gates 414, 416 and 418, the drain contact 420, and the source contact 422. Note that structures under the metal interconnect 424 are shown in dashed lines. In the example shown in FIG. 4A, the metal interconnect 424 extends across the second cell 412 in lateral direction 460.

The gate tie-off structure also includes a first gate contact 428 coupling gate 414 to the metal interconnect 424, a second gate contact 426 coupling gate 418 to the metal interconnect 424, and a via 430 coupling the source contact 422 to the metal interconnect 424. In this example, gates 414 and 418 are dummy gates that are electrically coupled (tied) to the source through the metal interconnect 424.

FIG. 4B shows a side view of the gate tie-off structure of the second cell 412. As shown in FIG. 4B, the metal interconnect 424 passes over the drain contact 420 and is separated from the drain contact 420 in the vertical direction 470 by a space. This allows the drain contact 420 to extend under the metal interconnect 424 in lateral direction 465 to reduce the drain contact resistance. The metal interconnect 424 also passes over the gate 416 of the transistor in the second cell 412, and is separated from the gate 416 of the transistor in the vertical direction 470 by a space.

The right-hand sides of FIGS. 4A and 4B show an example in which the drain side of the first cell 410 abuts the drain side of the second cell 412. Gates 316 and 414 are merged into gate 440, and the metal interconnects 322 and 424 are combined into a common metal interconnect 445, which extends across the first and second cells 410 and 412 in lateral direction 460. In this example, gate 440 is coupled to the metal interconnect 445 through gate contact 442, which is disposed between gate 440 and the metal interconnect 445. In addition, the sources in the first and second cells are coupled to a common power rail 450.

In this example, gate 440 at the drain-to-drain abutment is coupled (tied) to the sources in the first and second cells 410 and 412 through the metal interconnect 445. The metal interconnect 445 couples gate 440 to the sources even though gate 440 does not have a neighboring source (i.e., gate 440 is surrounded by drains on both sides). This is because the interconnect 445 is able to cross over gates 314 and 416 to couple gate 440 to the source contacts 320 and 422, respectively. Since gate 440 is coupled (tied) to the sources of the first and second cells through the metal interconnect 445, the channel under gate 440 is turned off, thereby providing electrical isolation between the transistors in the first and second cells. Therefore, the exemplary gate tie-off structure according to aspects of the present disclosure supports drain-to-drain abutment of two cells. The exemplary gate tie-off structure also supports source-to-drain abutment and source-to-source abutment as discussed further below.

In the example shown in FIG. 4A, the source contacts 320 and 422 are coupled to the common power rail 450 through vias 330 and 432, respectively. For the example in which the transistors in the first and second cells are PFETs, the power rail 450 may be a voltage supply rail (e.g., Vdd rail), and, for the example in which the transistors in the first and second cells are NFETs, the power rail 450 may be a ground rail (e.g., Vss rail). In certain aspects, the power rail 450 may be formed (e.g., using lithographic and etching processes) from the same metal layer (e.g., bottom-most metal layer of BEOL) as the metal interconnect 445, and run parallel with the metal interconnect 445.

FIG. 5A shows a top view of an example of source-to-drain abutment of a first cell 510 and a second cell 512. The first cell 510 includes multiple gates 514, 516 and 518, a source (labeled "S"), and a drain (labeled "D"). Gates 514 and 518 are located on the boundary of the first cell 510 in this example. Gate 516, the source, and the drain form a transistor in the first cell 510. The first cell 510 also includes a drain contact 520 disposed on the drain, and a source contact 522 disposed on the source. The first cell 510 also includes a via 532 electrically coupling the source contact 522 (and hence the source) to a power rail 535, which lies above the source contact 522. Note that structures below the power rail 535 are shown in dashed lines.

The first cell 510 further includes a gate tie-off structure including a metal interconnect 524, which may be formed from a metal layer (e.g., bottom-most metal layer) in the BEOL of the chip. The metal interconnect 524 lies above the gates 514, 516 and 518, the drain contact 520, and the source contact 522. Note that structures under the metal interconnect 524 are shown in dashed lines. In the example shown in FIG. 5A, the metal interconnect 524 extends across the first cell 510 in lateral direction 560.

The gate tie-off structure also includes a first gate contact 528 coupling gate 514 to the metal interconnect 524, a second gate contact 526 coupling gate 518 to the metal interconnect 524, and a via 530 coupling the source contact 522 to the metal interconnect 524. In this example, gates 514 and 518 are dummy gates that are electrically coupled (tied) to the source through the metal interconnect 524.

FIG. 5B shows a side view of the gate tie-off structure of the first cell 510. As shown in FIG. 5B, the metal interconnect 524 passes over the drain contact 520 and is separated from the drain contact 520 in the vertical direction 570 by a space. This allows the drain contact 520 to extend under the metal interconnect 524 in lateral direction 565 to reduce the drain contact resistance. The metal interconnect 524 also passes over the gate 516 of the transistor in the first cell 510, and is separated from the gate 516 of the transistor in the vertical direction 570 by a space.

The second cell 512 is structurally the same as the second cell 412 discussed above with reference to FIGS. 4A and 4B. Accordingly, the description of the second cell 412 provided above applies to the second cell 512 shown in FIGS. 5A and 5B.

The right-hand sides of FIGS. 5A and 5B show an example in which the source side of the first cell 510 abuts the drain side of the second cell 512. Gates 518 and 414 are merged into gate 540, and the metal interconnects 424 and 524 are combined into a common metal interconnect 545, which extends across the first and second cells 510 and 512 in lateral direction 560. In this example, gate 540 is coupled to the metal interconnect 545 through gate contact 542, which is disposed between gate 540 and the metal interconnect 545. In addition, the sources in the first and second cells are coupled to a common power rail 550.

In this example, gate 540 at the source-to-drain abutment is coupled (tied) to the sources in the first and second cells 510 and 512 through the metal interconnect 545. Since gate 540 is coupled (tied) to the sources of the first and second cells through the metal interconnect 545, the channel under gate 540 is turned off, thereby providing electrical isolation between the transistors in the first and second cells. Therefore, the exemplary gate tie-off structure according to aspects of the present disclosure supports source-to-drain abutment of two cells.

In the example shown in FIG. 5A, the source contacts 522 and 422 are coupled to the common power rail 550 through vias 532 and 432, respectively. For the example in which the transistors in the first and second cells are PFETs, the power rail 550 may be a voltage supply rail (e.g., Vdd rail), and, for the example in which the transistors in the first and second cells are NFETs, the power rail 550 may be a ground rail (e.g., Vss rail). In certain aspects, the power rail 550 may be formed (e.g., using lithographic and etching processes) from the same metal layer (e.g., bottom-most metal layer of BEOL) as the metal interconnect 545, and run parallel with the metal interconnect 545.

FIG. 6A shows a top view of an example of source-to-source abutment of a first cell 610 and a second cell 612. The first cell 610 is structurally the same as the first cell 510 discussed above with reference to FIGS. 5A and 5B. Accordingly, the description of the first cell 510 provided above applies to the first cell 610 shown in FIGS. 6A and 6B.

The second cell 612 includes multiple gates 614, 616 and 618, a source (labeled "S"), and a drain (labeled "D"). Gates 614 and 618 are located on the boundary of the second cell 612 in this example. Gate 616, the source, and the drain form a transistor in the second cell 612. The second cell 612 also includes a drain contact 620 disposed on the drain, and a source contact 622 disposed on the source. The second cell 612 also includes a via 632 electrically coupling the source contact 622 (and hence the source) to a power rail 635, which lies above the source contact 622. Note that structures below the power rail 635 are shown in dashed lines.

The second cell 612 further includes a gate tie-off structure including a metal interconnect 624, which may be formed from the same metal layer as the metal interconnect 524 of the first cell 610. The metal interconnect 624 lies above the gates 614, 616 and 618, the drain contact 620, and the source contact 622. Note that structures under the metal interconnect 624 are shown in dashed lines. In the example shown in FIG. 6A, the metal interconnect 624 extends across the second cell 612 in lateral direction 660.

The gate tie-off structure also includes a first gate contact 626 coupling gate 614 to the metal interconnect 624, a second gate contact 628 coupling gate 618 to the metal interconnect 624, and a via 630 coupling the source contact 622 to the metal interconnect 624. In this example, gates 614 and 618 are dummy gates that are electrically coupled (tied) to the source through the metal interconnect 624.

FIG. 6B shows a side view of the gate tie-off structure of the second cell 612. As shown in FIG. 6B, the metal interconnect 624 passes over the drain contact 620 and is separated from the drain contact 620 in the vertical direction 670 by a space. The metal interconnect 624 also passes over the gate 616 of the transistor in the second cell 612, and is separated from the gate 616 of the transistor in the vertical direction 670 by a space.

The right-hand sides of FIGS. 6A and 6B show an example in which the source side of the first cell 610 abuts the source side of the second cell 612. Gates 518 and 614 are merged into gate 640, and the metal interconnects 524 and 624 are combined into a common metal interconnect 645, which extends across the first and second cells 610 and 612 in lateral direction 660. In this example, gate 640 is coupled to the metal interconnect 645 through gate contact 642, which is disposed between gate 640 and the metal interconnect 645. In addition, the sources in the first and second cells are coupled to a common power rail 650.

In this example, gate 640 at the source-to-source abutment is coupled (tied) to the sources in the first and second cells 610 and 612 through the metal interconnect 645. Since gate 640 is coupled (tied) to the sources of the first and second cells through the metal interconnect 645, the channel under gate 640 is turned off, thereby providing electrical isolation between the transistors in the first and second cells. Therefore, the exemplary gate tie-off structure according to aspects of the present disclosure supports source-to-source abutment of two cells.

In the example shown in FIG. 6A, the source contacts 522 and 622 are coupled to the common power rail 650 through vias 532 and 632, respectively. For the example in which the transistors in the first and second cells are PFETs, the power rail 650 may be a voltage supply rail (e.g., Vdd rail), and, for the example in which the transistors in the first and second cells are NFETs, the power rail 650 may be a ground rail (e.g., Vss rail). In certain aspects, the power rail 650 may be formed (e.g., using lithographic and etching processes) from the same metal layer (e.g., bottom-most metal layer of BEOL) as the metal interconnect 645, and run parallel with the metal interconnect 645.

FIGS. 7A and 7B show a top view and a side view, respectively, of another example of drain-to-drain abutment of a first cell 710 and a second cell 712. The first cell 710 is similar to the first cell 410 in FIGS. 4A and 4B, in which elements that are common to both cells 710 and 410 are identified by the same reference numbers. The first cell 710 differs from the first cell 410 in FIGS. 4A and 4B in that the gate contact 324 in FIGS. 4A and 4B is omitted. As a result, gate 312 is not coupled to the metal interconnect 722 of the first cell 710. Also, the interconnect 722 differs from the interconnect 322 in FIGS. 4A and 4B in that the interconnect 722 does not extend over gate 312.

The second cell 712 is similar to the second cell 412 in FIGS. 4A and 4B, in which elements that are common to both cells 712 and 412 are identified by the same reference numbers. The second cell 712 differs from the second cell 412 in FIGS. 4A and 4B in that the gate contact 426 in FIGS. 4A and 4B is omitted. As a result, gate 418 is not coupled to the metal interconnect 724 of the second cell 712. Also, the interconnect 724 differs from the interconnect 424 in FIGS. 4A and 4B in that the interconnect 724 does not extend over gate 418.

The right-hand sides of FIGS. 7A and 7B show an example in which the drain side of the first cell 710 abuts the drain side of the second cell 712. Gates 316 and 414 are merged into gate 440, and the metal interconnects 722 and 724 are combined into a common metal interconnect 745. In this example, gate 440 is coupled to the metal interconnect 745 through gate contact 442, which is disposed between gate 440 and the metal interconnect 745. As shown in FIGS. 7A and 7B, the gate 440 at the drain-to-drain abutment is electrically coupled to the sources in the first and second cells 710 and 712 through the metal interconnect 745. This turns off the channel under gate 440, thereby providing electrical isolation between the transistors in the first and second cell 710 and 712. The interconnect 745 couples gate 440 to the sources even though gate 440 is surrounded on both sides by drain contacts 318 and 420 by crossing over the drain contacts 318 and 420 and gates 314 and 416, as shown in FIG. 7B.

FIGS. 8A and 8B show a top view and a side view, respectively, of another example of source-to-drain abutment of a first cell 810 and a second cell 812. The first cell 810 is similar to the first cell 510 in FIGS. 5A and 5B, in which elements that are common to both cells 810 and 510 are identified by the same reference numbers. The first cell 810 differs from the first cell 510 in FIGS. 5A and 5B in that the gate contact 526 in FIGS. 5A and 5B is omitted. As a result, gate 518 is not coupled to the metal interconnect 824 of the first cell 810. Also, the interconnect 824 differs from the interconnect 524 in FIGS. 5A and 5B in that the interconnect 824 does not extend over gate 518.

The second cell 812 is similar to the second cell 512 in FIGS. 5A and 5B, in which elements that are common to both cells 812 and 512 are identified by the same reference numbers. The second cell 812 differs from the second cell 512 in FIGS. 5A and 5B in that the gate contact 426 in FIGS. 5A and 5B is omitted. As a result, gate 418 is not coupled to the metal interconnect 826 of the second cell 812. Also, the interconnect 826 differs from the interconnect 424 in FIGS. 5A and 5B in that the interconnect 826 does not extend over gate 418.

The right-hand sides of FIGS. 8A and 8B show an example in which the source side of the first cell 810 abuts the drain side of the second cell 812. Gates 518 and 414 are merged into gate 540, and the metal interconnects 824 and 826 are combined into a common metal interconnect 845. In this example, gate 540 is coupled to the metal interconnect 845 through gate contact 542, which is disposed between gate 540 and the metal interconnect 845. As shown in FIGS. 8A and 8B, the gate 540 at the source-to-drain abutment is electrically coupled to the sources in the first cell 810 and the second cell 812 through the metal interconnect 845. This turns off the channel under gate 440, thereby providing electrical isolation between the source in the first cell 810 and the drain in the second cell 812.

FIGS. 9A and 9B show a top view and a side view, respectively, of another example of source-to-source abutment of a first cell 910 and a second cell 912. The first cell 910 is similar to the first cell 610 in FIGS. 6A and 6B, in which elements that are common to both cells 910 and 610 are identified by the same reference numbers. The first cell 910 differs from the first cell 610 in FIGS. 6A and 6B in that the gate contact 526 in FIGS. 6A and 6B is omitted. As a result, gate 518 is not coupled to the metal interconnect 924 of the first cell 910. Also, the interconnect 924 differs from the interconnect 524 in FIGS. 6A and 6B in that the interconnect 924 does not extend over gate 518.

The second cell 912 is similar to the second cell 612 in FIGS. 6A and 6B, in which elements that are common to both cells 912 and 612 are identified by the same reference numbers. The second cell 912 differs from the second cell 612 in FIGS. 6A and 6B in that the gate contact 626 in FIGS. 6A and 6B is omitted. As a result, gate 614 is not coupled to the metal interconnect 926 of the second cell 912. Also, the interconnect 926 differs from the interconnect 624 in FIGS. 6A and 6B in that the interconnect 926 does not extend over gate 614.

The right-hand sides of FIGS. 9A and 9B show an example in which the source side of the first cell 910 abuts the source side of the second cell 912. Gates 518 and 614 are merged into gate 640 at the source-to-source abutment of the first and second cells 910 and 912. In this example, gate 640 is floating (i.e., not coupled to metal interconnect 924 or metal interconnect 926). Also, gate 640 is surrounded by the sources in the first and second cells 910 and 912, in which the sources are biased at the same potential by the common power rail 650 (e.g., Vdd or Vss). Since the sources in the first and second cells 910 and 912 are at the same potential in this example, gate 640 does not need to provide electrical isolation between the sources, and therefore does not need to be tied off in this example.

Figure 10A:
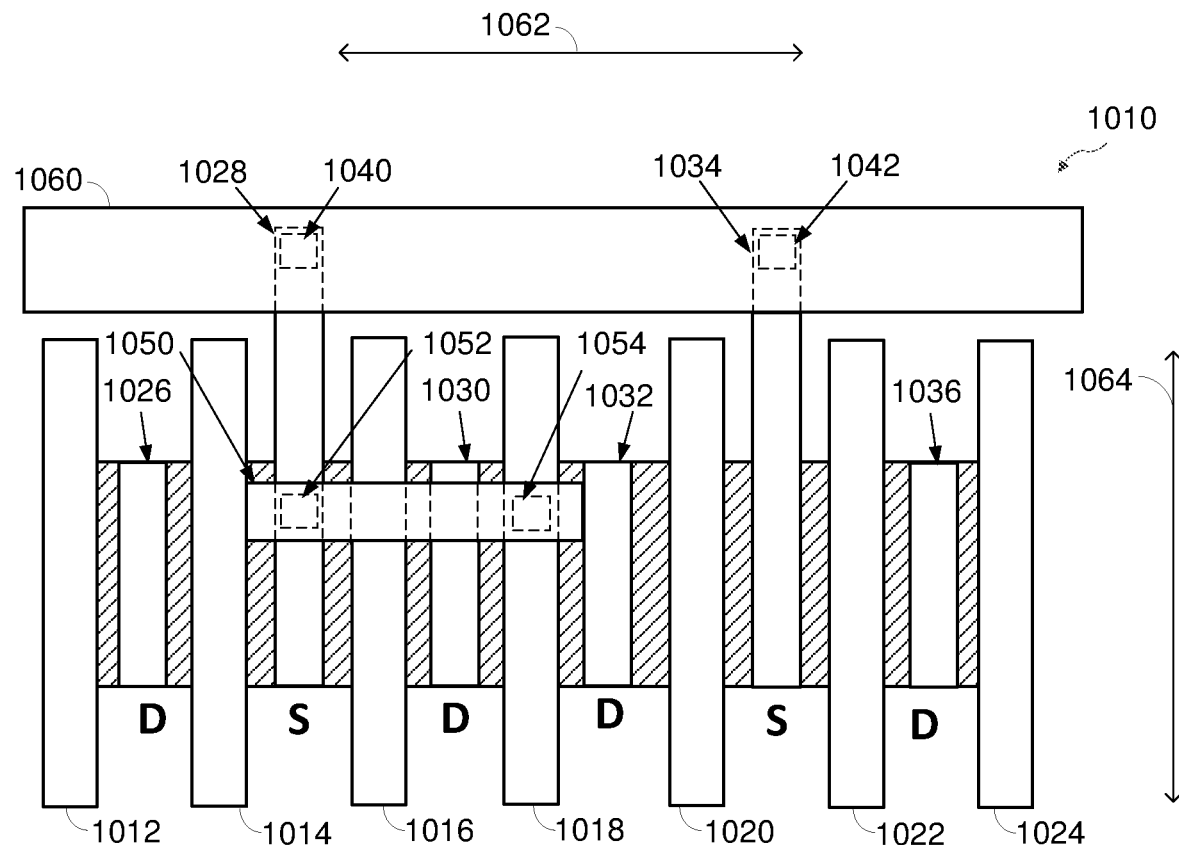
FIG. 10A shows a top view of an example of a cell including a gate tie-off structure according to certain aspects of the present disclosure.

Gate tie-off structures according to aspects of the present disclosure may be used within a cell to tie off one or more gates within the cell. In this regard, FIG. 10A shows a top view of an exemplary cell 1010 including multiple gates 1012, 1014, 1016, 1018, 1020, 1022 and 1024, sources (labeled "S"), and drains (labeled "D"). In this example, each source is located between a respective pair of gates, and each drain is located between a respective pair of gates. The cell 1010 also includes drain contacts 1026, 1030, 1032 and 1036, in which each drain contact is disposed on a respective one of the drains. The cell 1010 also includes source contacts 1028 and 1034, in which each source contact is disposed on a respective one of the sources. The cell further includes a power rail 1060 and vias 1040 and 1042 coupling the source contacts 1028 and 1034, respectively, to the power rail 1060.

The cell 1010 includes a gate tie-off structure including a metal interconnect 1050, which may be formed from the same metal layer as the power rail 1060 or a different metal layer. The metal interconnect 1050 lies above gates 1016 and 1018, drain contact 1030 and source contact 1028. Note that structures under the metal interconnect 1050 are shown in dashed lines. In the example in FIG. 10A, the metal interconnect 1050 extends partially across the cell 1010 in lateral direction 1062.

The gate tie-off structure also includes a gate contact 1054 disposed between gate 1018 and the metal interconnect 1050, and a via 1052 disposed between the source contact 1028 and the metal interconnect 1050. In this example, the gate contact 1054 couples gate 1018 to the metal interconnect 1050, and the via 1052 couples the source contact 1028 to the metal interconnect 1050. Thus, gate 1018 is electrically coupled to the source contact 1028 (and hence the respective source) through the gate contact 1054, the metal interconnect 1050, and the via 1052. Thus, in this example, gate 1018 is a dummy gate that is electrically coupled (tied) to one of the sources of the cell 1010 through the metal interconnect 1050 to provide electrical isolation between transistors on opposite sides of gate 1018.

Figure 10B:
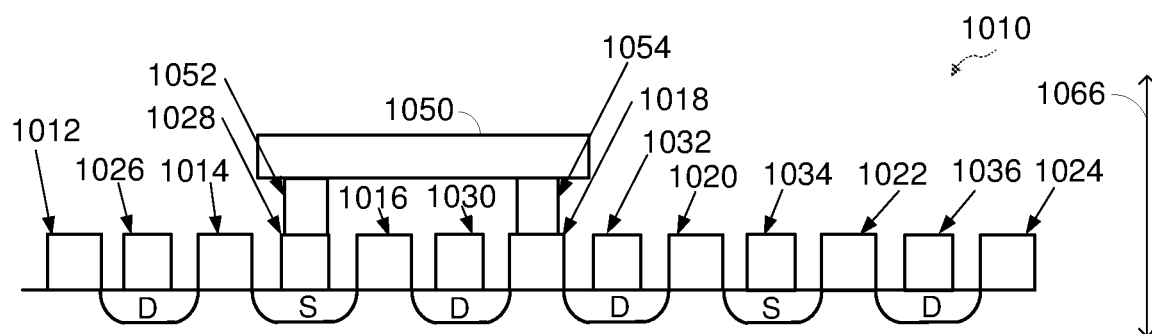
FIG. 10B shows a side view of the cell shown in FIG. 10A.

FIG. 10B shows a side view of the exemplary gate tie-off structure. As shown in FIG. 10B, the metal interconnect 1050 passes (crosses) over drain contact 1030, and is separated from drain contact 1030 in the vertical direction 1066 by a space. Similarly, the metal interconnect 1050 passes (crosses) over gate 1016, and is separated from gate 1016 in the vertical direction 1066 by a space. This allows the metal interconnect 1050 to cross over drain contact 1030 and gate 1016 to couple gate 1018 to source contact 1028 without shorting the metal interconnect 1050 to the drain contact 1030 and gate 1016. The vertical space between the drain contact 1030 and the metal interconnect 1050 allows the drain contact 1030 to extend under the metal interconnect 1050 in lateral direction 1064, as shown in FIG. 10A.

Figure 11:
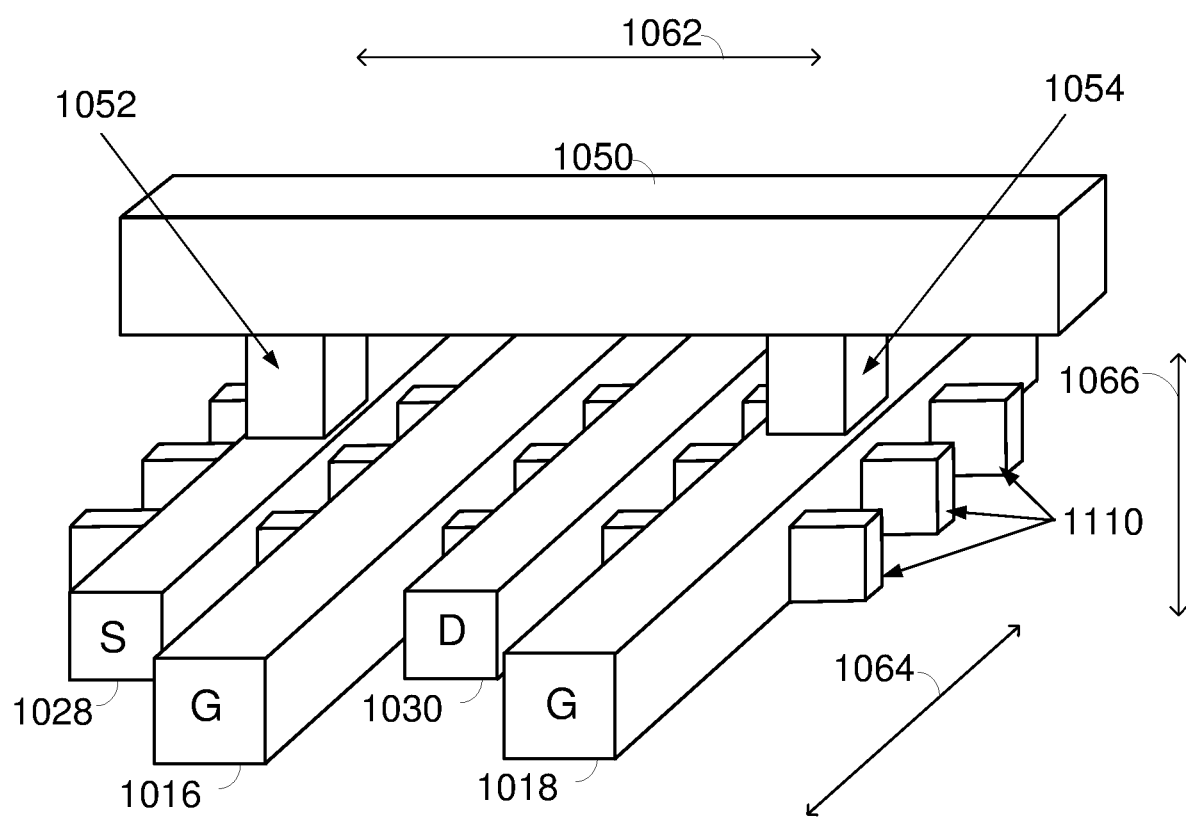
FIG. 11 show a perspective view of an example in which the cell in FIG. 10A includes multiple fins according to certain aspects of the present disclosure.

In the example shown in FIG. 10B, the sources and the drains are depicted as doped regions in the substrate of the chip (die) for a planar transistor. However, it is to be appreciated that for the example of a finFET, the source and drain may be formed from multiple fins that extend across the cell 1010 in lateral direction 1062. In this regard, FIG. 11 shows a perspective view of a portion of the cell 1010 in which the cell 1010 includes multiple fins 1110 that extend across the cell 1010 in lateral direction 1062. In this example, each of gates 1016 and 1018 is formed over a respective portion of the fins 1110 with a thin dielectric layer (not shown) disposed between the gate and the fins 1110. Thus, in this example, the fins run continuously through the gates. The drain contact 1030 is disposed on a portion of the fins 1110 forming the respective drain, and the source contact 1028 is disposed on a portion of the fins 1110 forming the respective source.

As shown in FIG. 11, the vertical space (gap) between the metal interconnect 1050 and the drain contact 1030 in vertical direction 1066 allows the drain contact 1030 to extend under the metal interconnect 1050 in lateral direction 1064. The extension of the drain contact 1030 in lateral direction 1064 allows the drain contact 1030 to make electrical contact with all of the fins 1110 for low drain contact resistance. The space (gap) between the drain contact 1030 and the metal interconnect 1050 may be filled with an electrical isolation material.

Although FIG. 11 shows an example in which the cell 1010 include three fins, it is to be appreciated that the cell 1010 may include a different number of fins. Also, although FIG. 11 shows an example in which each fin has a rectangular cross section, it is to be appreciated that each fin may have another cross-sectional shape (e.g., a tampered shape).

It is to be appreciated that the fins 1110 may be used in any of the embodiments discussed above in which the fins may extend across one or more cells. For the examples in which two cells abut each other, the fins may run continuously through the gate located at the abutment of the cells (e.g., gate 440, gate 540 or gate 640). In this case, the gate at the abutment may be tied off to provide electrical isolation between the two cells without cutting (breaking) the fins under the gate.

It is to be appreciated that the cell 1010 may also include one or more additional gate tie-off structures (not shown) in addition to the exemplary gate tie-off structure shown in FIGS. 10A and 10B. In this case, the one or more additional gate tie-off structures and the exemplary gate tie-off structure shown in FIGS. 10A and 10B may share a common metal interconnect that extends across the cell 1010 in lateral direction 1062.

Figure 12A:
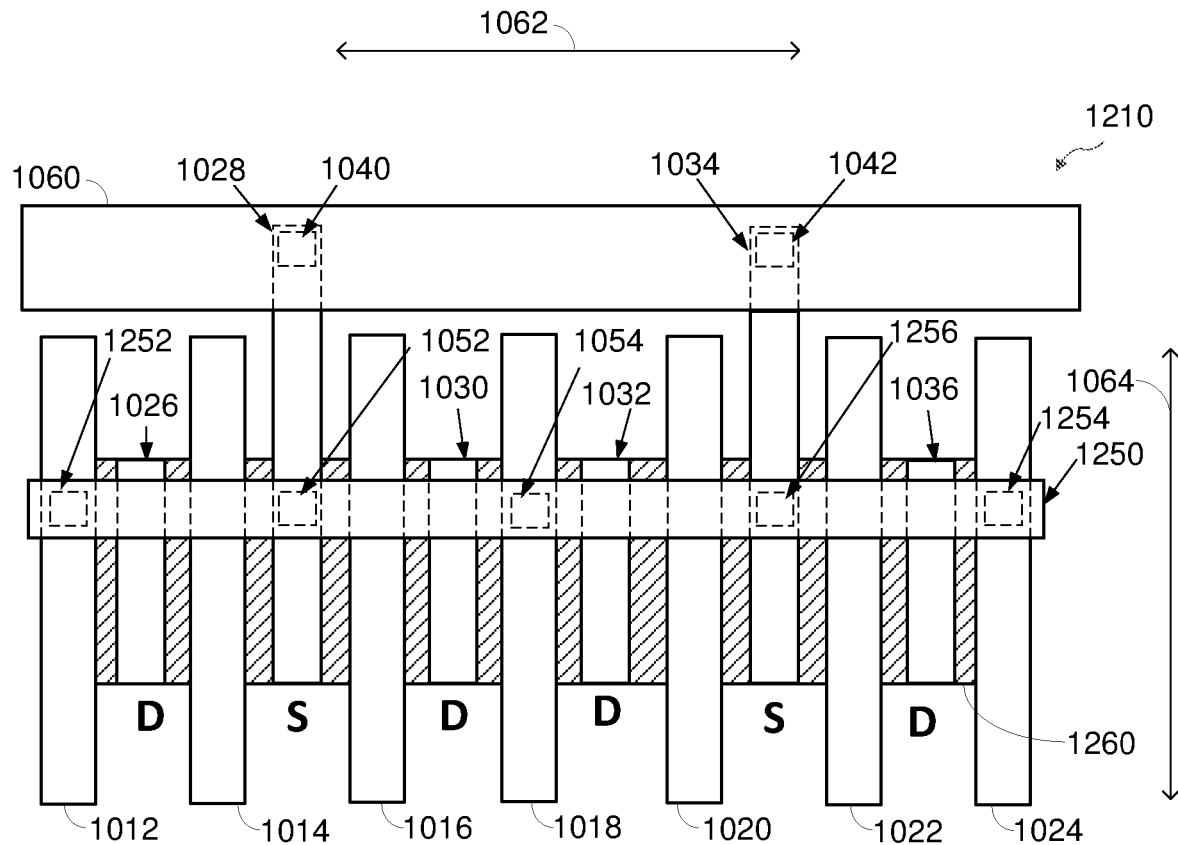
FIG. 12A shows a top view of another example of a cell including a gate tie-off structure according to certain aspects of the present disclosure.

In this regard, FIG. 12A shows a top view of an exemplary cell 1210 including a metal interconnect 1250 that extends across the cell 1210. The cell 1210 is similar to the cell 1010 in FIG. 10A, in which elements that are common to both cells 1010 and 1210 are identified by the same reference numbers.

The metal interconnect 1250 in FIG. 12A differs from the metal interconnect 1050 shown in FIG. 10A in that metal interconnect 1250 extends across the cell 1210. The metal interconnect 1250 may be formed from the same metal layer as the power rail 1060 or a different metal layer. The metal interconnect 1250 lies above the gates 1012, 1014, 1016, 1018, 1020, 1022 and 1024, the drain contacts 1026, 1030, 1032 and 1036, and the source contacts 1028 and 1034. Note that structures under the metal interconnect 1250 are shown in dashed lines.

As shown in FIG. 12A, gate contact 1054 couples gate 1018 to the metal interconnect 1250, and via 1052 couples the source contact 1028 to the metal interconnect 1250, similar to the cell 1010 in FIG. 10A. The cell 1250 also includes gate contact 1252 disposed between gate 1012 and the metal interconnect 1250, and gate contact 1254 coupled between gate 1024 and the metal interconnect 1250. Gate contact 1252 couples gate 1012 to the metal interconnect 1250, and gate contact 1254 couples gate 1024 to the metal interconnect 1250. Thus, gate 1012 is coupled to the source contact 1028 (and hence the respective source) through the metal interconnect 1250, and gate 1024 is coupled to the source contact 1028 (and hence the respective source) through the metal interconnect 1250. Since gates 1012 and 1024 are located on the boundary of the cell 1250, electrically coupling gates 1012 and 1024 to the source through metal interconnect 1250 provides electrical isolation for the transistors in the cell 1210 from other cells (not shown).

Figure 12B:
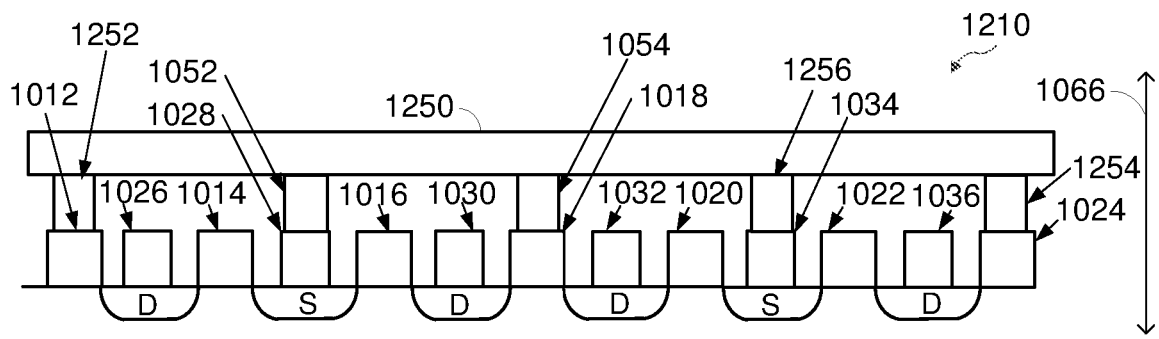
FIG. 12B shows a side view of the cell shown in FIG. 12A.

FIG. 12B shows a side view of the cell 1210. As shown in FIG. 12B, the metal interconnect 1250 passes (crosses) over the drain contacts 1026, 1030, 1032 and 1036, and is separated from the drain contacts in the vertical direction 1066 by a space. This allows the metal interconnect 1250 to cross over the drain contacts without shorting the metal interconnect 1250 to the drain contacts. Also, in this example, the metal interconnect 1250 passes (crosses) over gates 1014, 1016, 1020 and 1022 and is separated from these gates in the vertical direction 1066 by a space. This allows the metal interconnect 1250 to cross over these gates without shorting the metal interconnect 1250 to these gates.

In the example shown in FIGS. 12A and 12B, the cell 1210 also includes a via 1256 coupling source contact 1034 to the metal interconnect 1250. Thus, in this example, gate 1018 is coupled to two sources through the metal interconnect 1250, in which gate 1018 is located between the two sources.

In the example shown in FIG. 12A, the cell 1210 includes a continuous active region 1260 (represented as a shaded region in FIG. 12A) that extends across the cell 1210 in lateral direction 1062. In this example, at least a portion of each of the gates 1014, 1016, 1018, 1020 and 1022, each of the sources, and each of the drains is within the continuous active region 1260. For a FinFET process, the continuous active region 1260 includes fins that extend across the cell 1210 in lateral direction 1062. In this example, the fins run continuously through the gates 1014, 1016, 1018, 1020 and 1022 without cuts (breaks) in the fins.

The exemplary cells discussed above may be predefined in a standard cell library that defines various cells that can be placed on a chip (die) for a certain semiconductor processor. For each cell in the cell library, the cell library may define a layout of transistors in the cell, an interconnect structure for interconnecting transistors in the cell, and/or a gate tie-off structure for the cell. Multiple instances of a cell in the cell library may be placed on the chip (die).

In certain aspects, each cell in the cell library may be configured to perform a respective logic function. In these aspects, the function of a circuit may be broken down into multiple logic functions during the design phase, where each logic function may be performed by one of the cells in the cell library. The cells that perform the logic functions may then be paced on the chip and interconnected to implement the circuit on the chip. The cells may be interconnected by upper metal layers in the BEOL. Thus, in this example, the cells serve as building blocks for the circuit.

Figure 13A:
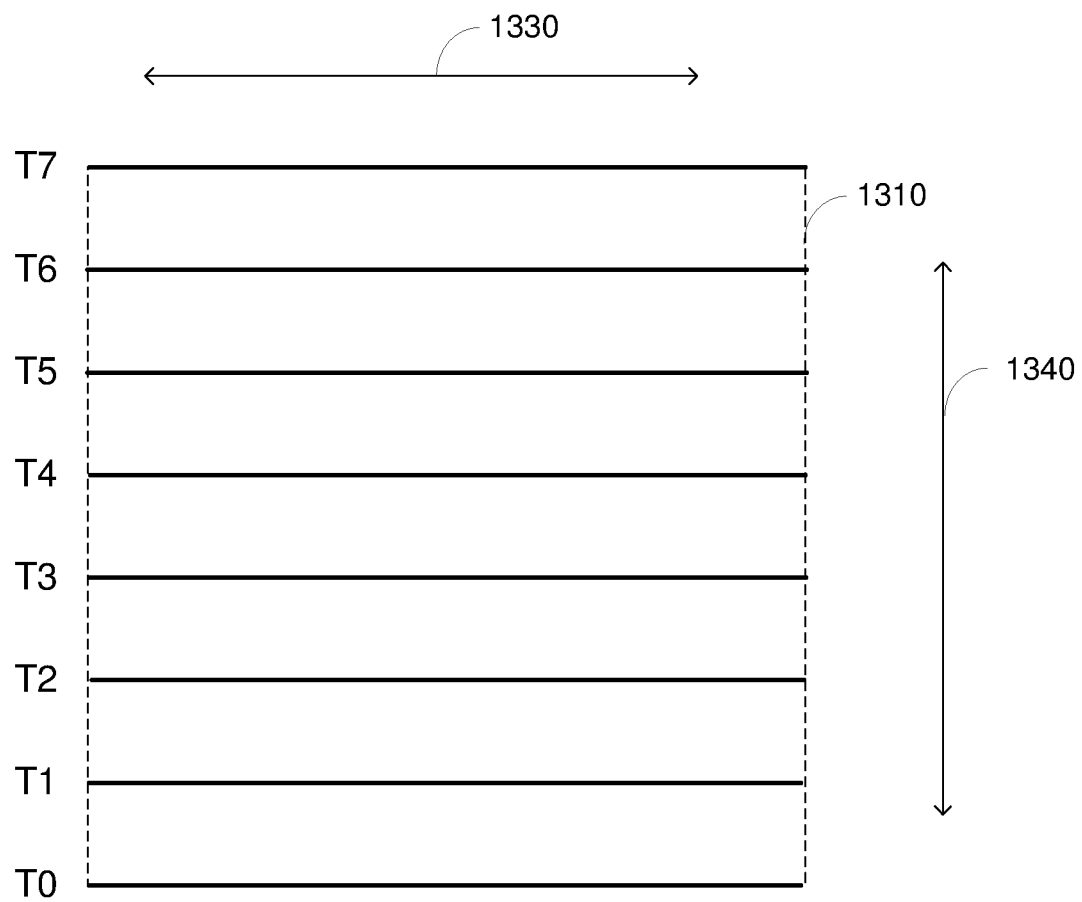
FIG. 13A shows an example of multiple tracks for a cell according to certain aspects of the present disclosure.

Layout parameters for cells on a chip may include tracks, which define available paths in the cells for metal lines formed from a particular metal layer (e.g., the bottom-most metal layer of the BEOL). In this regard, FIG. 13A illustrates multiple tracks for an exemplary cell 1310 according to certain aspects of the present disclosure. In FIG. 13A, the tracks are labeled T0 to T7 and are represented by multiple lines extending across the cell 1310 in lateral direction 1330. The tracks run parallel with one another and are spaced apart in lateral direction 1340, where lateral direction 1340 is approximately perpendicular to lateral direction 1330. As used herein, the term "approximately perpendicular" indicates that the angle between two directions is between 85 and 95 degrees. It is to be appreciated that the cell 1310 is not limited to the exemplary number of tracks shown in FIG. 13A, and that the cell 1310 may have a different number of tracks.

The tracks define available paths in the cell 1310 for metal lines formed from a particular metal layer (e.g., the bottom-most metal layer of the BEOL). In other words, the tracks define where metal lines formed from the metal layer can be placed on the cell. In this example, a metal interconnect may be placed on one of the tracks to tie off one or more gates in the cell 1310, and a power rail may be placed on a different one of the tracks. In addition, metal lines used for signal routing may be placed on one or more tracks that are different from the tracks used for the metal interconnect and the power rail. For example, these metal lines may be used for routing signals to or from drain(s) in the cell, and/or routing signals to or from gate(s) in the cell.

Figure 13B:
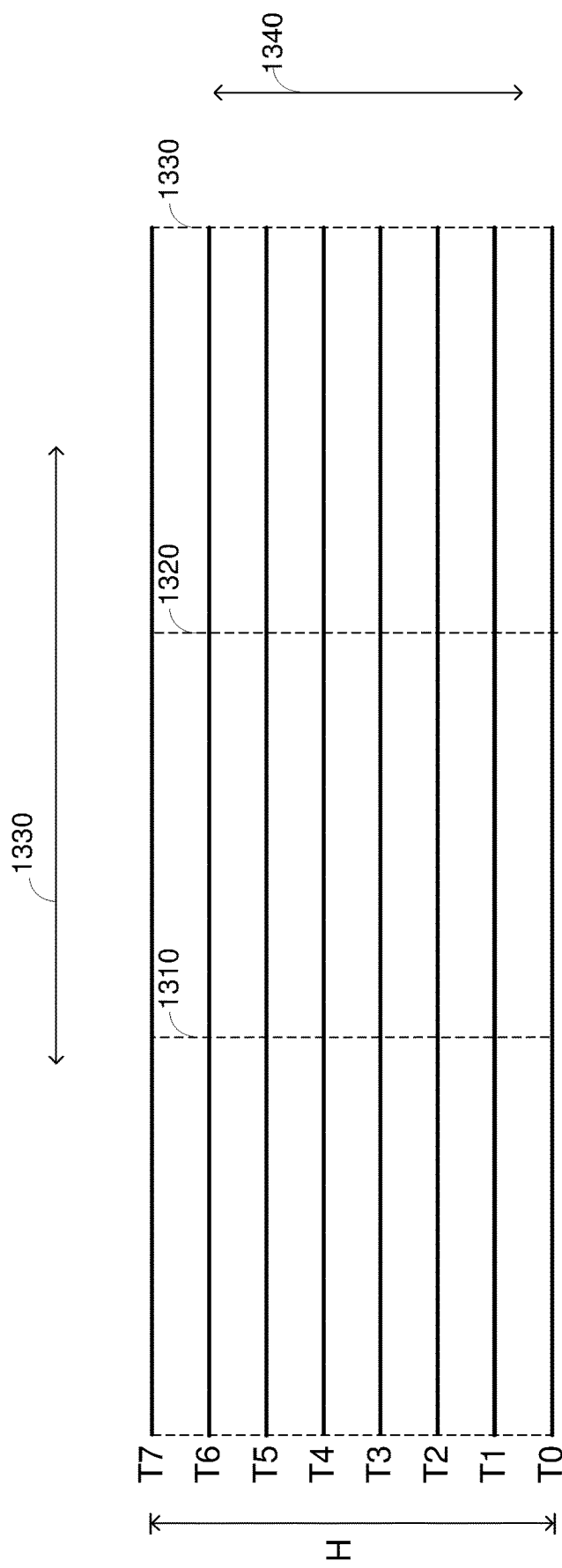
FIG. 13B shows an example of multiple tracks for multiple cells according to certain aspects of the present disclosure.

FIG. 13B shows an example of multiple tracks (labeled T0 to T7) for multiple cells 1310 to 1330 located in the same row on the chip, in which the boundaries of the cells 1310 to 1330 are indicated by dashed lines in FIG. 13B. In this example, cell 1320 is adjacent to cells 1310 and 1310, and is located between cells 1310 and 1330.

As shown in FIG. 13B, the cells 1310 to 1330 have the same number of tracks and the same height (labeled "H"). In this example, the tracks (labeled T0 and T7) shown in FIG. 13B represent available paths for placing metal lines formed from the same metal layer (e.g., bottom-most metal layer in the BEOL) in the cells 1310 to 1330. The cells 1310 to 1330 may each include a metal interconnect (not shown in FIG. 13B) for gate tie-off, in which the metal interconnects of the cells 1310 to 1330 are placed on the same track. Thus, in this example, the metal interconnects of the cells 1310 to 1330 extend along lateral direction 1330, and are aligned with one another in lateral direction 1340 since they are located on the same track. In general, metal lines located on the same track are aligned with one another in lateral direction 1340. The metal interconnects of the cells 1310 to 1330 may be combined into one continuous metal interconnect that extends across the cells 1310 to 1330 or may be separate metal interconnects that are spaced apart by gaps in lateral direction 1330.

Each of the cells 1310 to 1330 in FIG. 13B may be an instance (i.e., copy) of any one of the exemplary cells shown in FIGS. 3A, 3B, 4A, 4B, 5A, 5B, 6A, 6B, 7A, 7B, 8A, 8B, 9A, 9B, 10A and 10B, in which lateral direction 1330 corresponds to lateral directions 340, 460, 560, 660 and 1062, and lateral direction 1340 corresponds to lateral directions 342, 465, 565, 665 and 1066. Two or more of the cells 1310 to 1330 may each be a separate instance of the same cell shown in one of the above figures.

As discussed above, any one of the exemplary metal interconnects discussed above may be formed (e.g., using lithographic and etching processes) from the bottom-most metal layer in the BEOL of the chip. The bottom-most metal layer may be referred to as metal layer M0 or metal layer M1 depending on whether the designation of the metal layers in the BEOL starts at M0 or M1.

Although FIGS. 3B, 4B, 5B, 6B, 7B, 8B, 9B and 10B show examples in which gate contacts are coupled directly to the metal interconnect, it is to be appreciated that the present disclosure is not limited to this example. For example, each of these gate contacts may be coupled to the metal interconnect through a respective via disposed between the gate contact and the respective metal interconnect.

Within the present disclosure, the word "exemplary" is used to mean "serving as an example, instance, or illustration." Any implementation or aspect described herein as "exemplary" is not necessarily to be construed as preferred or advantageous over other aspects of the disclosure. Likewise, the term "aspects" does not require that all aspects of the disclosure include the discussed feature, advantage or mode of operation. The term "coupled" is used herein to refer to the direct or indirect coupling between two structures.

Any reference to an element herein using a designation such as "first," "second," and so forth does not generally limit the quantity or order of those elements. Rather, these designations are used herein as a convenient way of distinguishing between two or more elements or instances of an element. Thus, a reference to first and second elements does not mean that only two elements can be employed, or that the first element must precede the second element.

It is to be understood that present disclosure is not limited to the terminology used above to describe aspects of the present disclosure. For example, an active region may also be referred to as a diffusion region or another term. In another example, a power rail may also be referred to as a power grid or another term.

The previous description of the disclosure is provided to enable any person skilled in the art to make or use the disclosure. Various modifications to the disclosure will be readily apparent to those skilled in the art, and the generic principles defined herein may be applied to other variations without departing from the spirit or scope of the disclosure.

Thus, the disclosure is not intended to be limited to the examples described herein but is to be accorded the widest scope consistent with the principles and novel features disclosed herein.

What is claimed is:

1. A chip, comprising:
   a first gate;
   a first source;
   a first source contact disposed on the first source;
   a first metal interconnect above the first source contact and the first gate;
   a first gate contact electrically coupling the first gate to the first metal interconnect;
   a first via electrically coupling the first source contact to the first metal interconnect;
   a second gate;
   a second source;
   a second source contact disposed on the second source;
   a second metal interconnect above the second source contact and the second gate;
   a second gate contact electrically coupling the second gate to the second metal interconnect;
   a second via electrically coupling the second source contact to the second metal interconnect;
   wherein each of the first metal interconnect and the second metal interconnect extends along a first lateral direction, the first metal interconnect is aligned with the second metal interconnect in a second lateral direction, and the first lateral direction is approximately perpendicular to the second lateral direction;
   a third gate; and
   a fourth gate;
   wherein the third gate is between the first source and the first gate, the first metal interconnect passes over the third gate, the fourth gate is between the second source and the second gate, and the second metal interconnect passes over the fourth gate.

2. The chip of claim 1, further comprising:
   a power rail;
   a third via electrically coupling the first source contact to the power rail; and
   a fourth via electrically coupling the second source contact to the power rail.

3. The chip of claim 2, wherein the power rail is a voltage supply rail or a ground rail.

4. The chip of claim 2, wherein the first metal interconnect, the second metal interconnect, and the power rail are formed from a same metal layer.

5. The chip of claim 2, wherein the first metal interconnect and the second metal interconnect are spaced apart from one another in the first lateral direction.

6. The chip of claim 1, wherein the first metal interconnect, and the second metal interconnect are formed from a same metal layer.

7. The chip of claim 1, wherein the first metal interconnect and the second metal interconnect are spaced apart from one another in the first lateral direction.

8. The chip of claim 1, further comprising:
   a drain; and
   a drain contact disposed on the drain;
   wherein the drain is between the first source and the first gate, and the drain extends under the first metal interconnect.

9. The chip of claim 1, wherein at least a portion of the first gate, at least a portion of the second gate, the first source, and the second source are within a continuous active region.

10. A chip, comprising:
    a first gate extended along a second lateral direction;
    a first source electrically coupled to a power rail;
    a first metal interconnect extended along a first lateral direction approximately perpendicular to the second lateral direction, wherein the first metal interconnect lies above the first gate and the first source, and the first metal interconnect is configured to electrically couple the first gate to the first source;
    a second gate extended along the second lateral direction;
    a second source electrically coupled to the power rail; and
    a second metal interconnect extended along the first lateral direction, wherein the second metal interconnect lies above the second gate and second source, the second metal interconnect is configured to electrically couple the second gate to the second source, and the first metal interconnect is aligned with the second metal interconnect in the second lateral direction.

11. The chip of claim 10, wherein the power rail is a ground rail.

12. The chip of claim 10, further comprising a third gate extended along the second lateral direction, wherein the third gate is between the first source and the second source, and the third gate is floating.

13. The chip of claim 12, wherein the third gate is next to the first source and next to the second source.

14. The chip of claim 12, wherein the first metal interconnect and the second metal interconnect are spaced apart from one another in the first lateral direction.

15. The chip of claim 10, wherein the first metal interconnect and the second metal interconnect are in a bottommost metal layer of back end of line (BEOL).

16. The chip of claim 10, wherein the power rail is extended along the first lateral direction.

17. The chip of claim 10, further comprising:
    a third gate; and
    a fourth gate;
    wherein the third gate is between the first source and the first gate, the first metal interconnect passes over the third gate, the fourth gate is between the second source and the second gate, and the second metal interconnect passes over the fourth gate.

18. The chip of claim 17, wherein the third gate is next to the first source, and the fourth gate is next to the second source.

19. The chip of claim 17, wherein the third gate and the fourth gate are not dummy gates.

* * * * *